US011152415B2

(12) United States Patent
Lim et al.

(10) Patent No.: US 11,152,415 B2
(45) Date of Patent: Oct. 19, 2021

(54) IMAGE SENSOR WITH SEPARATION PATTERN AND IMAGE SENSOR MODULE INCLUDING THE SAME

(71) Applicant: SAMSUNG ELECTRONICS CO., LTD., Suwon-si (KR)

(72) Inventors: Ha-Jin Lim, Seoul (KR); Kook-Tae Kim, Hwaseong-si (KR); Jong-Min Jeon, Suwon-si (KR); Jae-Sung Hur, Yongin-si (KR); Hye-Ri Hong, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/506,074

(22) Filed: Jul. 9, 2019

(65) Prior Publication Data

US 2020/0127025 A1 Apr. 23, 2020

(30) Foreign Application Priority Data

Oct. 22, 2018 (KR) .................. 10-2018-0126241

(51) Int. Cl.
*H01L 27/146* (2006.01)
*H04N 5/369* (2011.01)

(52) U.S. Cl.
CPC .... *H01L 27/1463* (2013.01); *H01L 27/14623* (2013.01); *H01L 27/14636* (2013.01); *H04N 5/379* (2018.08); *H01L 27/14683* (2013.01)

(58) Field of Classification Search
CPC ........... H01L 27/1463; H01L 27/14623; H01L 27/14636; H01L 27/14683; H04N 5/379
See application file for complete search history.

(56) References Cited

U.S. PATENT DOCUMENTS

| | | | |
|---|---|---|---|
| 8,415,189 B2 | 4/2013 | Kwon et al. | |
| 8,735,251 B2 | 5/2014 | Andry et al. | |
| RE45,633 E | 7/2015 | Mouli | |
| 9,564,463 B2 | 2/2017 | Ihara | |
| 9,780,142 B1 | 10/2017 | Koo et al. | |
| 9,786,704 B2 | 10/2017 | Cheng et al. | |
| 9,806,117 B2 | 10/2017 | Zheng et al. | |
| 2008/0102557 A1 | 5/2008 | Kim et al. | |
| 2014/0246707 A1* | 9/2014 | Koo ................. | H01L 27/14689 257/230 |
| 2016/0204144 A1* | 7/2016 | Lee .................. | H01L 27/14623 257/229 |

(Continued)

*Primary Examiner* — Padma Haliyur
(74) *Attorney, Agent, or Firm* — Lee IP Law, P.C.

(57) ABSTRACT

An image sensor includes a photoelectric converter in a pixel area of a substrate to generate photoelectrons in response to an incident light that is incident onto the pixel area, a signal generator on a first surface of the substrate in the pixel area to generate electric signals corresponding to image information of an object in accordance with the photoelectrons, and a pixel separation pattern penetrating through the substrate from the first surface of the substrate to a second surface of the substrate opposite to the first surface of the substrate, the pixel separation pattern including an insulation pattern having a refractive index smaller than that of the substrate and a metallic conductive pattern enclosed by the insulation pattern, and the pixel area being enclosed by the pixel separation pattern and isolated from a neighboring pixel area.

22 Claims, 33 Drawing Sheets

(56) References Cited

U.S. PATENT DOCUMENTS

2016/0211306 A1\* 7/2016 Choi ................. H01L 27/14643
2016/0351604 A1 12/2016 Kalnitsky et al.
2017/0005121 A1\* 1/2017 Lenchenkov ......... H04N 5/353
2019/0296060 A1\* 9/2019 Oh .................... H01L 27/14607
2019/0386049 A1\* 12/2019 Jung ................ H01L 27/14685

\* cited by examiner

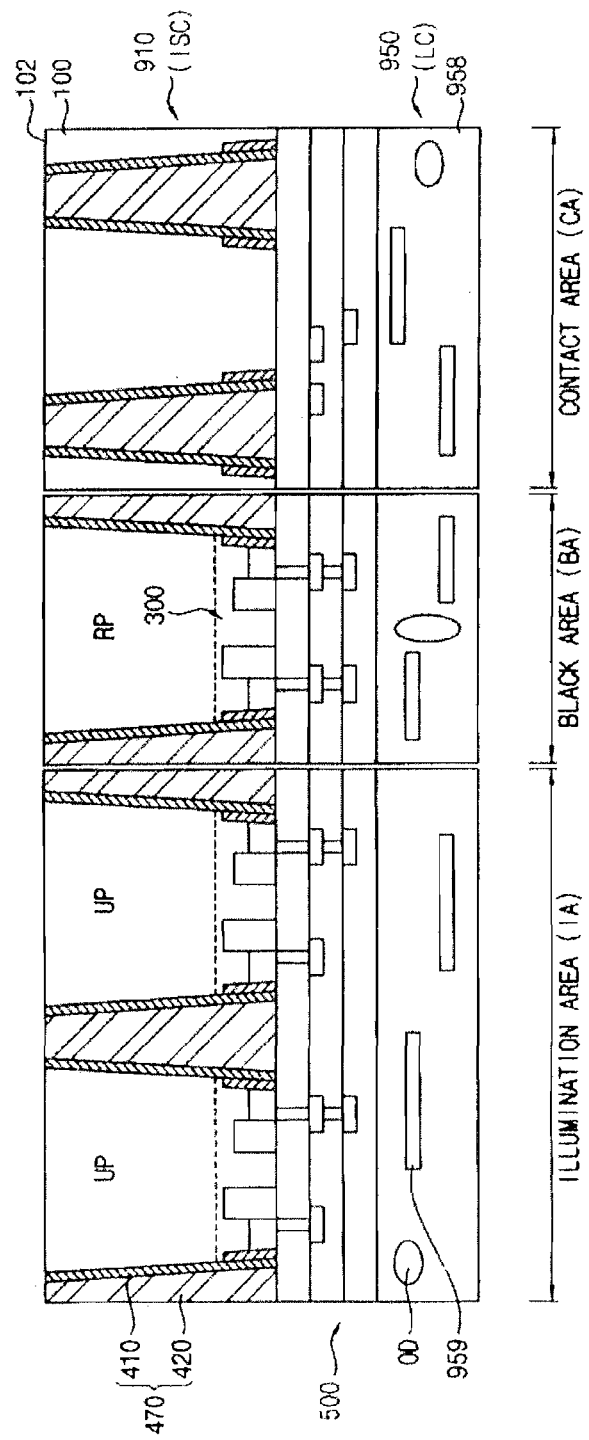

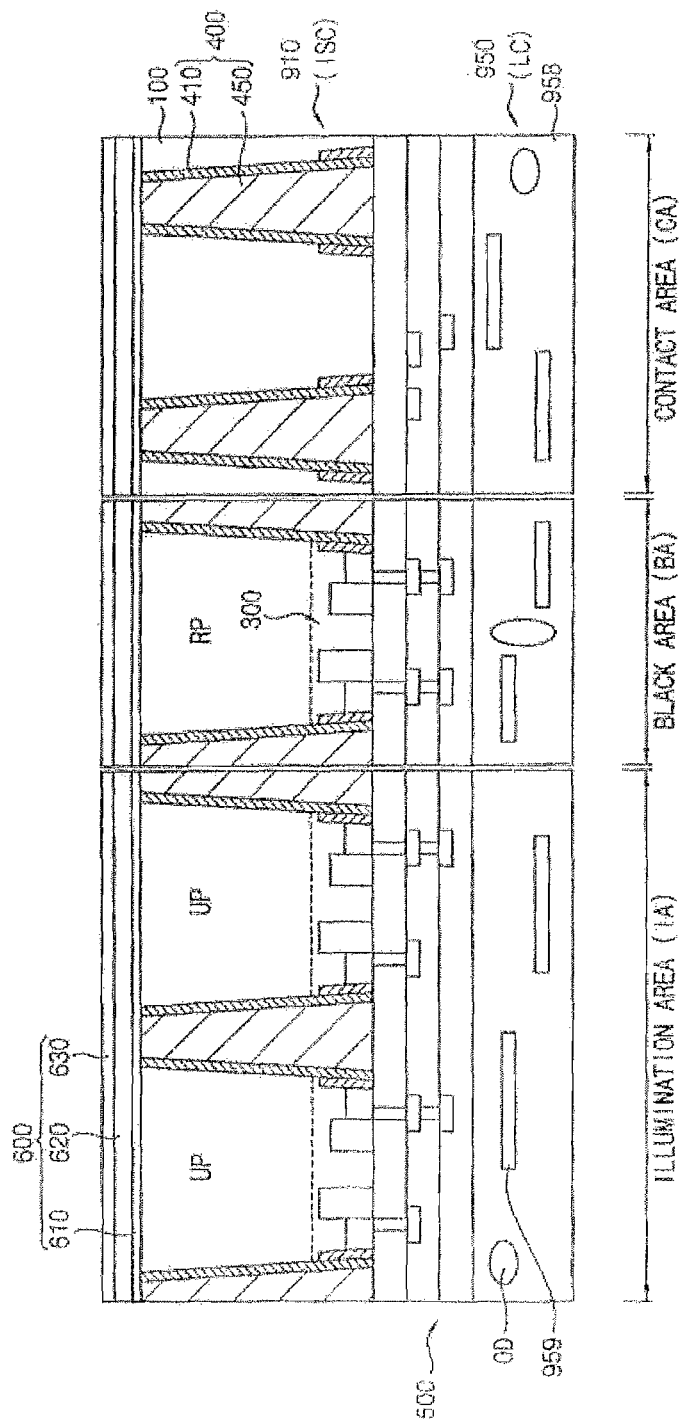

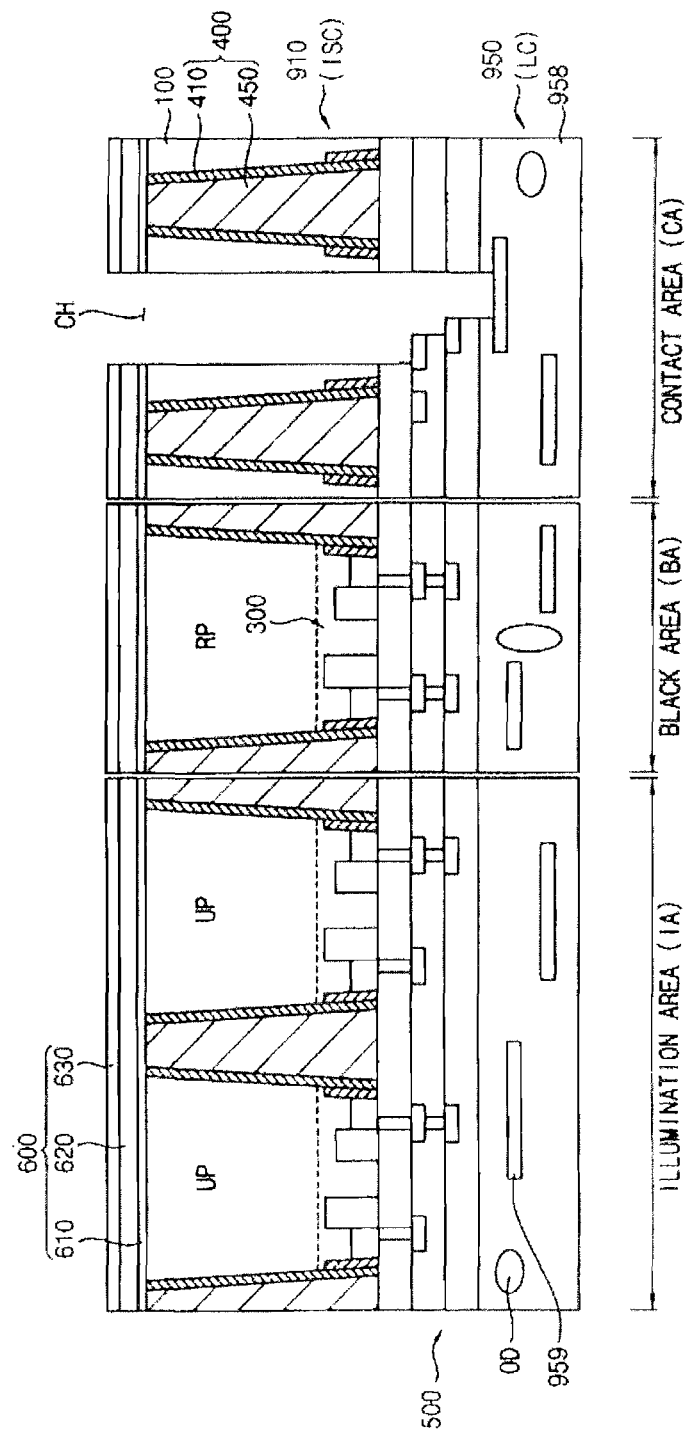

IMAGE SENSOR WITH SEPARATION PATTERN AND IMAGE SENSOR MODULE INCLUDING THE SAME

CROSS-REFERENCE TO RELATED APPLICATION

Korean Patent Application No. 10-2018-0126241, filed on Oct. 22, 2018, in the Korean Intellectual Property Office, and entitled: "Image Sensor, Image Sensor Module and Method of Manufacturing the Image Sensor," is incorporated by reference herein in its entirety.

BACKGROUND

1. Field

Example embodiments relate to an image sensor, an image sensor module having the image sensor and a method of manufacturing the image sensor, and more particularly, to a CMOS image sensor, an image sensor module having the CMOS image sensor and a method of manufacturing the CMOS image sensor.

2. Description of the Related Art

Recently, high resolution image sensor modules have been widely used in various digital devices, e.g., a digital camera and a smart phone, and thus there has been a great demand for an image sensor for covering optical signals (or image signals) into electrical signals. For example, a charge coupled device (CCD) and a complementary metal oxide silicon (CMOS) device have been mostly used as the image sensor.

Particularly, the CMOS image sensor (CIS) can be manufactured by the conventional semiconductor manufacturing processes and the image quality of the CIS can be simply and easily improved just by improving signal processing algorithms. For that reasons, the CIS has been more widely used in recent digital devices.

SUMMARY

According to exemplary embodiments, there is provided an image sensor including a photoelectric converter in a pixel area of the substrate and generating photoelectrons in response to an incident light that is incident onto the pixel area, a signal generator arranged on a first surface of the substrate in each pixel area and generating electric signals corresponding to image information of an object in accordance with the photoelectrons, a pixel separation pattern penetrating through the substrate from the first surface to the second surface such that the pixel area may be enclosed by the pixel separation pattern and may be isolated from a neighboring pixel area. The pixel separation pattern may include an insulation pattern having a refractive index smaller than that of the substrate and a metallic conductive pattern enclosed by the insulation pattern.

According to exemplary embodiments, there is provided an image sensor module including an image sensor having a plurality of unit pixels for generating electric signals corresponding to an image of an object in accordance with an incident light such that the unit pixels may be separated and isolated from one another by a separation pattern penetrating through the substrate, and an image signal processor (ISP) electrically connected to the image sensor and processing the electric signals to thereby generate image data of the object. The separation pattern may include an insulation pattern and a metallic conductive pattern enclosed by the insulation pattern.

According to exemplary embodiments, there is provided a method of manufacturing the above image sensor. An ion implantation process may be conducted onto a first surface of a substrate having an illumination area, a black area and a contact area, thereby forming a photoelectric converter layer in the illumination area and the black area of the substrate. The photoelectric converter layer may generate photoelectrons in accordance with an incident light. Then, a dummy separation pattern may be formed to extend from a first surface of the substrate to an inside of the substrate to thereby define a pixel area having a photoelectric converter, a reference cell area having a photoelectric converter and a contact margin area in the illumination area, the black area and the contact area of the substrate, respectively. The dummy separation pattern may include an insulation pattern having a refractive index smaller than that of the substrate and a dummy pattern enclosed by the insulation pattern. A signal generator and a wiring structure connected to the signal generator may be sequentially formed on the first surface of the substrate. The signal generator may generate electric signals corresponding an image of an object in accordance with photoelectrons. A rear portion of the substrate opposite to the first surface may be partially removed until the dummy separation pattern may be exposed through a second surface of the substrate. Then, a metal replacement process may be conducted to the second surface of the substrate to thereby replace the dummy pattern with metallic conductive pattern.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
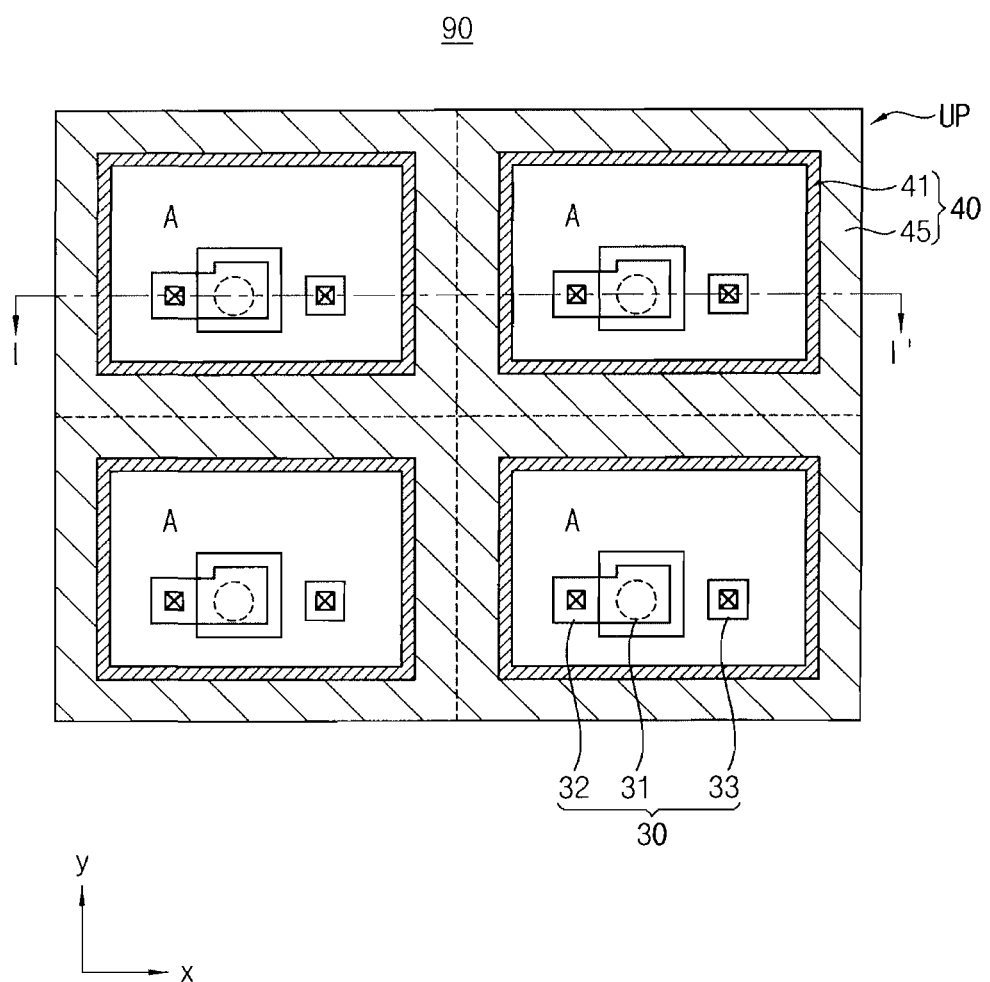
FIG. 1 illustrates a plan view of an image sensor in accordance with an example embodiment.

Reference will now be made to example embodiments, which are illustrated in the accompanying drawings, wherein like reference numerals may refer to like components throughout.

Figure 2:
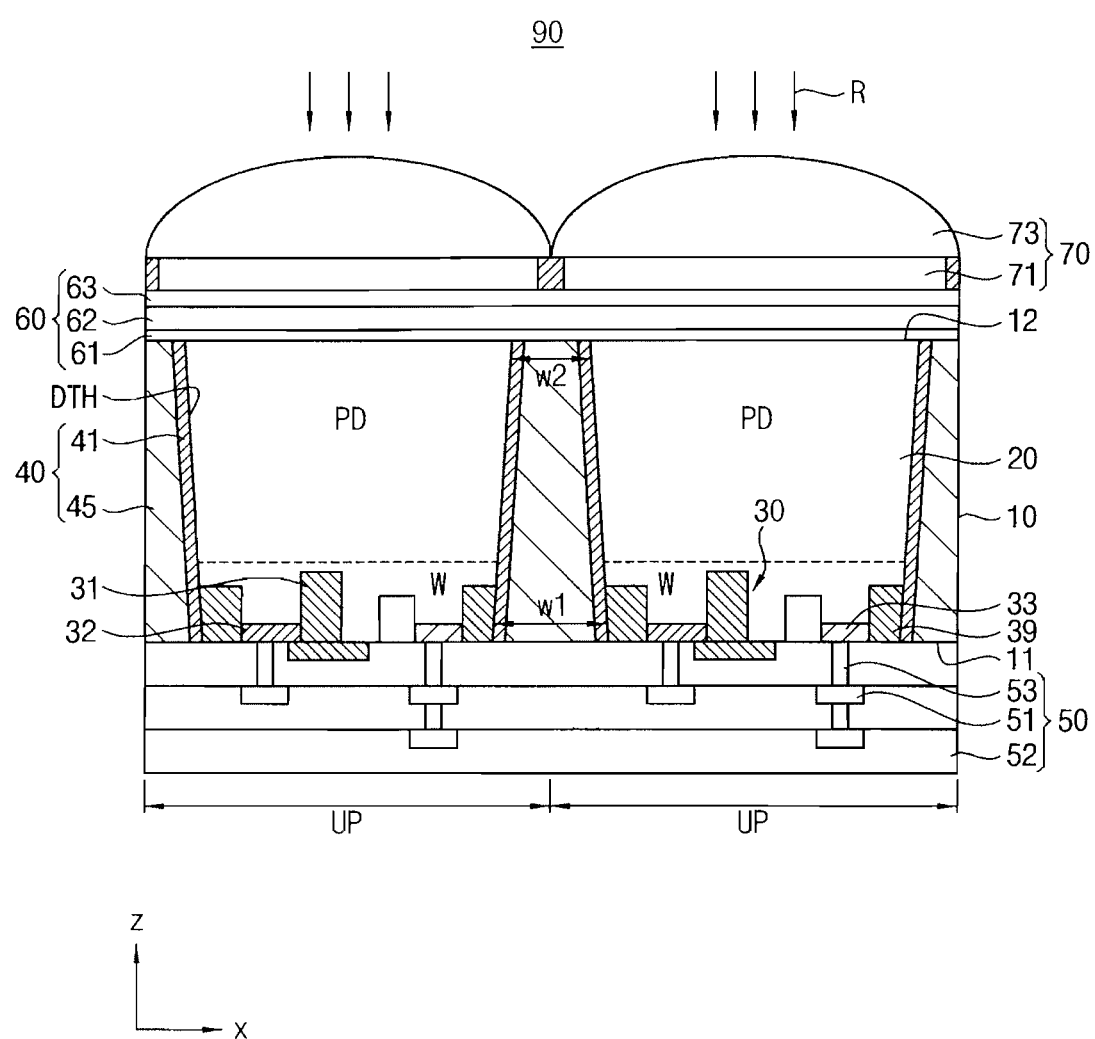
FIG. 2 illustrates a cross sectional view along line I-I' of FIG. 1.

FIG. 1 is a plan view illustrating an image sensor in accordance with an example embodiment, and FIG. 2 is a cross sectional view along line I-I' of FIG. 1.

Referring to FIGS. 1 and 2, an image sensor 90 in accordance with an example embodiment may include a substrate 10 having a plurality of pixel areas A, a photoelectric converter 20 arranged in the substrate 10 at each pixel area A and generating photoelectrons in response to an incident light R incident onto the pixel area A, a signal generator 30 generating electrical signals corresponding to the photoelectrons as image signals, and a pixel separation pattern 40 penetrating through the substrate 10 and enclosing the pixel area A in such a configuration that the pixel separation pattern 40 includes an insulation pattern 41 having a smaller refractive index than the substrate 10 and a metallic conductive pattern 45 filled into the insulation pattern 41. Thus, the photoelectric converter 20, the signal generator 30, and the pixel separation pattern 40 in the pixel area A may constitute a unit pixel UP of the image sensor 90.

For example, the substrate 10 may include a semiconductor substrate. In an example embodiment, the semiconductor substrate 10 may include a bulk silicon substrate onto which a plurality of p-type impurities may be locally doped, so some p-type wells may be arranged on the bulk silicon substrate. Further, a p-type epitaxial layer may be further arranged on the p-type bulk silicon substrate, so the substrate 10 may include a bi-layered semiconductor substrate. Further still, the bulk silicon substrate may be removed from the bi-layered semiconductor substrate, so the substrate 10 may include a p-type single epitaxial layer. In addition, the substrate 10 may include an n-type bulk substrate, an n-type epitaxial layer and the bi-layered semiconductor of the n-type bulk substrate and the n-type epitaxial layer.

The substrate 10 may include a first surface 11 and a second surface 12 opposite the first surface 11. The first surface 11 may correspond to a front surface of a silicon wafer, and the signal generator 30 and a wiring structure 50 may be arranged on the first surface 11 of the substrate 10, e.g., the first surface 11 of the substrate 10 may face the wiring structure 50. The signal generator 30 may include at least a transistor that may be formed by semiconductor manufacturing processes. The second surface 12 may correspond to a rear surface of the silicon wafer, and a buffer layer 60 and a light transmitting unit 70 may be arranged on the second surface 12 of the substrate 10, e.g., the second surface 12 of the substrate 10 may face the buffer layer 60. Thus, the image sensor 90 may be configured to be a back-side illumination structure in which the light may be incident from outside onto the second surface 12, i.e., onto the back side of the substrate 10.

The substrate 10 may be separated into the plurality of the pixel areas A by deep trench holes DTH, e.g., the pixel areas A may be arranged in the x and y directions in a matrix pattern, and the pixel separation pattern 40 may be positioned in each of the deep trench holes DTH. Thus, neighboring pixel areas A adjacent to each other may be separated from each other by the pixel separation pattern 40, e.g., in the x and y directions.

The photoelectric converter 20 and the signal generator 30 may be arranged in each of the pixel areas A. The photoelectric converter 20 may be positioned in the substrate 10 and may generate the photoelectrons in response to the incident light R that is incident onto the corresponding pixel area A. The signal generator 30 may be arranged on the first surface 11 of the substrate 10 and may generate the electrical signals corresponding to the photoelectrons. For example, as illustrated in FIG. 2, the photoelectric converter 20 may be positioned within the substrate 10 between the second surface 12 of the substrate 10 and the signal generator 30. For example, as illustrated in FIG. 2, the signal generator 30 may be positioned within the substrate 10 between the first surface 11 of the substrate 10 and the photoelectric converter 20. The electrical signals may provide image information of an object from which the incident light may be reflected.

Particularly, one or more photoelectric converters 20 may be arranged in a single pixel area A, and a plurality of electron-hole pairs may be generated in response to the incident light R and collected in the photoelectric converter 20. The electron-hole pairs generated by the incident light R are widely known as photoelectrons. That is, the photoelectric converter 20 may be positioned deep in the pixel area A, thus the photoelectric converter 20 may be positioned around the second surface 12 far from the first surface 11, e.g., the photoelectric converter 20 may be positioned closer to the second surface 12 than to the first surface 11. In addition, the photoelectric converter 20 may cross, e.g., overlap, substantially a whole surface of the pixel area A for enlarging a light receipt area as much as possible, thereby increasing a light receiving efficiency of the photoelectric converter 20.

For example, the photoelectric converter 20 may include a first doping layer and a second doping layer that may be vertically stacked in the p-type semiconductor substrate 10 to which a plurality of p-type impurities may be doped. In the present example embodiment, the first doping layer may include n-type impurities and the second doping layer may include p-type impurities. Thus, the substrate 10, the first doping layer and the second doping layer may be configured into a PNP junction structure in the substrate 10, and the photoelectric converter 20 may function as a photodiode PD. That is, the photodiode PD may be provided as the photoelectric converter 20.

While the present example embodiment discloses the photodiode PD as the photoelectric converter 20, any other photoelectric structures may also be used as the photoelectric converter 20. For example, a photo transistor, a photo gate, and a pinned photo diode (PPD) may also be used as the photoelectric converter 20.

In addition, the present example embodiment discloses that a single photoelectric converter 20 may be arranged in a single pixel area A, but embodiments are not limited thereto. For example, two or more photoelectric converters 20 may also be arranged in a single pixel area A according to configurations of the image sensor 90.

For example, the signal generator 30 may be arranged at surface portions of the first surface 11 of the substrate 10 at each pixel area A and may generate the electric signals corresponding to the photoelectrons as the image information of an object. A well area W may be provided between the first surface 11 and the photoelectric converter 20. The well area W may be doped with impurities of a different semiconductor type than those of the photoelectric converter 20. The well area W may be separated into a plurality of active regions and a field region defining the active regions. A device isolation layer may be formed on the field region, and the neighboring active regions may be electrically isolated from each other by the device isolation layer.

A plurality of transistors may be arranged on the active regions of the first surface 11. For example, a transfer transistor 31, a floating diffusion node 32, and at least a signal transistor 33 may be arranged on the active regions of the first surface 11. The transfer transistor 31 may transfer the photoelectrons from the photoelectric converter 20 to the floating diffusion node 32, and thus, the photoelectrons may be accumulated in the floating diffusion node 32. The signal transistor 33 may be connected to the floating diffusion node 32 and may generate electric signals corresponding to a potential difference or a voltage of the photoelectrons in the floating diffusion node 32.

The transfer transistor 31 may vertically extend into the substrate 10 from the first surface 11 toward the photoelectric converter 20 until a lower end of the transfer transistor 31 may be positioned near the photoelectric converter 20. For example, the transfer transistor 31 may include a conductive portion that may be arranged on the first surface 11 and a transfer gate extending into the substrate 10 from the conductive portion toward the photoelectric converter 20. A gate signal may be applied to the conductive portion of the transfer transistor 31, and the photoelectrons of the photoelectric converter 20 may be transferred to the floating diffusion node 32 in response to the gate signal. Since the transfer efficiency of photoelectrons may be determined by the length of the effective channel of the transfer gate, various shapes and configurations may be allowable to the transfer gate as long as the length of the effective channel may be maximized. For example, the transfer gate may be shaped into a cup or a pillar.

The photoelectrons of the photoelectric converter 20 may be transferred to and accumulated in the floating diffusion node 32, and thus the accumulated photoelectrons may be varied by the incident light that may be incident onto the respective pixel area A. Thus, the potential difference or the voltage (hereinafter, referred to node voltage) of the photoelectrons of the floating diffusion node 32 may be varied by the pixel unit A. The floating diffusion node 32 may be positioned on the first surface 11 between the transfer gate and the device isolation layer 39. The floating diffusion node 32 may be doped with impurities of which the semiconductor type may be different from that of the well area W.

The signal transistor 33 may generate the electric signals corresponding to the accumulated photoelectrons of the floating diffusion node 32. The electric signals may give the image information of an object.

For example, the signal transistor 33 may include a reset transistor, a driver transistor (which is sometimes referred to as a source follower) and a selection transistor. The reset transistor may remove the photoelectrons from the floating diffusion node 32 and may reset the charge state of the floating diffusion node 32. The driver transistor or the source follower may amplify the node voltage for facilitating the detection of the node voltage. The selection transistor may detect the amplified node voltage in response to a selection signal. The floating diffusion node 32 may be connected to a source electrode of the reset transistor and simultaneously to a gate electrode of the drive transistor. The drive transistor may be connected to the selection transistor.

While the present example embodiment discloses that the signal transistor 33 is configured to a 3-transistor structure having three transistors, the signal transistor 33 may be configured to another transistor structure. For example, the signal transistor 33 may be configured to a 1-transistor structure, a 2-transistor structure or 4 or 5-transistor structure according to the characteristics and usages of the image sensor 90. Further, the reset transistor, the drive transistor and the selection transistor may be arranged on the photoelectric converter 20 or may be spaced apart from the photoelectric converter 20.

For example, the pixel separation pattern 40 may be configured to be a penetration structure penetrating through the substrate 10 between the first surface 11 and the second surface 12 and may enclose the pixel area A. Thus, the plurality of pixel areas A may be defined and separated from each other by the pixel separation pattern 40.

The pixel separation pattern 40 may include the insulation pattern 41 and the conductive pattern 45. The insulation pattern 41 may penetrate through the substrate 10 from the first surface 11 to the second surface 12, e.g., along the z direction, and may include an insulation material having a smaller refractive index than that of the substrate 10. For example, as illustrated in FIG. 2, the insulation pattern 41 may have top and bottom surfaces coplanar with the second and first surfaces 12 and 11 of the substrate 10, respectively. For example, as illustrated in FIG. 2, the insulation pattern 41 may extend along, e.g., define, sidewalls of the pixel area A. The conductive pattern 45 may be filled in the insulation pattern 41 and may be enclosed by the insulation pattern 41, e.g., the conductive pattern 45 may be filled in a region between two facing insulation patterns 41 of two respective adjacent pixel areas A.

In detail, the insulation pattern 41 may be provided as a sidewall liner arranged on an inner surface or an inner sidewall of the deep trench hole DTH, e.g., the insulation pattern 41 may cover the entire inner sidewall of each deep trench hole DTH. The conductive pattern 45 may fill a remainder of the deep trench hole DTH between facing portions of the insulation pattern 41, e.g., the insulation pattern 41 may be between the conductive pattern 45 and a corresponding pixel area A.

For example, when the substrate 10 is a silicon wafer having a refractive index of about 3.5, the insulation pattern 41 may include silicon oxide (SiO2) having a refractive index of about 1.5. Thus, even when the incident light R is incident onto the pixel area A obliquely to the second surface 12 of the substrate 10, the oblique light may be reflected from the insulation pattern 41 into the pixel area A, thereby increasing the efficiency of the photoelectric converter 20. In addition, since each unit pixel UP may be covered by its own color filter 71, the incident light R passing through the color filter 71 does not need to be sufficiently separated from the neighboring incident light R passing through the neighboring color filter 71, as the incident lights R passing through the color filters 71 are sufficiently prevented from leakage into neighboring unit pixels UP due to the separation pattern 40, thereby preventing light interference between the unit pixels UP of the image sensor 90.

The conductive pattern 45 may include low resistive metals and may be provided as a single conductive line that may be individually connected to each unit pixel UP. An external power source may be connected to the single conductive line.

When the photoelectrons are generated in the photoelectric converter 20, some of the photoelectrons may be trapped on a boundary surface between the photoelectric converter 20 and the insulation pattern 41. Thus, a dark current may be generated on the boundary surface of the insulation pattern 41. The dark current may not disappear in spite of the reset operation to the floating diffusion node 32. That is, the electric signals may be detected from the floating diffusion node 32 after the charge reset of the floating diffusion node 32, which may give rise to noise defects in the image sensor 90.

When a negative bias is applied to the conductive pattern 45, the trapped charged may be sufficiently removed from the boundary surface between the insulation pattern 41 and the photoelectric converter 20, thereby removing the dark currents from the insulation pattern 41 and minimizing the noise defects. Particularly, a white spot defect of an image may be effectively prevented by the removal of the dark currents.

For example, the conductive pattern 45 may include at least one of titanium nitride (TiN), tantalum nitride (TaN), tungsten (W) and copper (Cu). Particularly, the conductive pattern 45 may be formed by a metal replace process that will described in detail hereinafter, and the electrical resistance of the conductive pattern 45 may be sufficiently reduced. Accordingly, the negative bias may be applied to the conductive pattern 45 more efficiently.

In a modified example embodiment, the conductive pattern 45 may include transparent conductive oxide (TCO) having good total reflection characteristics. For example, the TCO may include indium tin oxide (ITO). The TCO may have a refractive index similar to that of silicon, and thus the incident light R may be totally reflected from the TCO into the unit pixel UP although the incident light R may transmit through the insulation pattern 41, thereby increasing the efficiency of the photoelectric converter 20 and minimizing the light interference between the neighboring unit pixels UP.

According to comparative image sensors, the deep trench may be filled with polysilicon that functions as an electrode to which the negative bias is applied. However, as recent image sensors have been gradually downsized and the aspect ratio of the deep trench has also increased, the electrical resistance of the polysilicon has increased. In contrast, according to the example embodiment, the relatively high resistive polysilicon may be replaced with the low resistive metallic conductive pattern 45 and the negative bias may be easily and efficiently applied to the conductive pattern 45, thereby sufficiently minimizing the dark currents in the image sensor 90.

In the present example embodiment, the pixel separation pattern 40 may be shaped into a trapezoid of which the width, e.g., along the x direction, may decrease in a direction oriented from the first surface 11 to the second surface 12. The trapezoidal pixel separation pattern 40 may include a first width W1, e.g., along the x direction, near the first surface 11, and a second width W2, e.g., along the x direction, near the second surface 12. Thus, the pixel separation pattern 40 may be narrowed from the signal generator 30 toward a micro lens 73, i.e., to have the first width W1 larger than the second width W2. As a result, the pixel area A measured along the second surface 12, e.g., an area of a surface of the photodiode P1) of the photoelectric converter 20 facing the micro lens 73 (FIGS. 1 and 2), may be increased, thereby maximizing the receipt area of the incident light R on the second surface 12 of the substrate 10. As such, the efficiency and the photo sensitivity of the photoelectric converter 20 may be increased.

Particularly, the second width W2 of the pixel separation pattern 40 may be about 60% to about 80% of the first width W1. When the second width W2 is larger than about 90% of the first width W1, the receipt area of the second surface 12, to which the incident light R is illuminated, may be substantially the same as the area of the first surface 11 in the unit pixel UP, and thus the increase of the incident light R may be insignificant in spite of the trapezoidal shape of the pixel separation pattern 40. Further, when the second width W2 of the pixel separation pattern 40 is smaller than about 60% of the first width W1, the neighboring unit pixels UP adjacent to each other may be difficult to separate from each other by the pixel separation pattern 40, thereby generating light interferences between the neighboring unit pixels UP. For those reasons, the second width W2 of the pixel separation pattern 40 may be about 60% to about 80% of the first width W1. For example, the second width W2 may be in a range of about 80 nm to about 100 nm, and the second width W1 may be in a range of about 50 nm to about 90 nm.

In the present example embodiment, the thickness of the insulation pattern 41, e.g., along the x direction, may be uniform between the first surface 11 and the second surface 12, while the thickness of the conductive pattern 45, e.g., along the x direction, may decrease from the first surface 11 to the second surface 12. The insulation pattern 41 may be provided as the sidewall liner covering the inner surfaces or sidewalls of the deep trench hole DTH, and the conductive pattern 45 may fill up the inside of the deep trench hole DTH that may be defined by the insulation pattern 41. Therefore, the insulation pattern 41 may have a uniform thickness while the conductive pattern 45 may have a non-uniform thickness.

The pixel separation pattern 40 may be variously modified according to the characteristics and requirements of the image sensor 90, as will be described with reference to FIGS. 3-6B.

Figure 3:
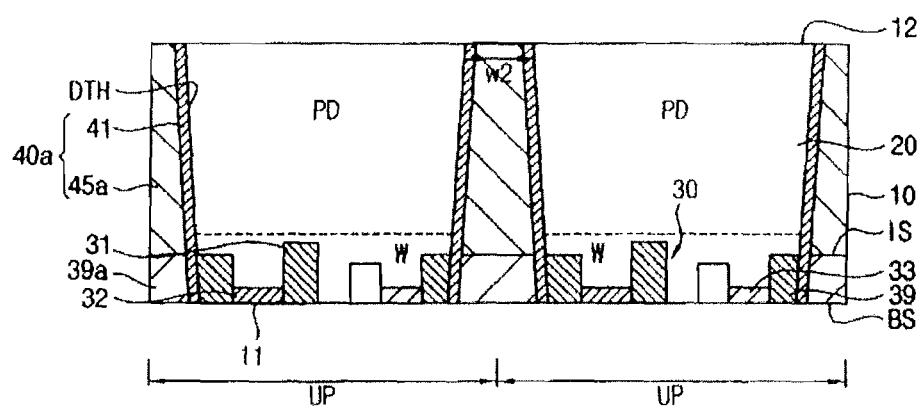
FIG. 3 illustrates a cross sectional view of a first modification of the image sensor in FIG. 2.

FIG. 3 is a cross sectional view illustrating a first modification of the image sensor in FIG. 2. In FIG. 3, the image sensor may have substantially the same structure as the image sensor in FIG. 2, except for the pixel separation pattern. Thus, in FIG. 3, same reference numerals denote the same elements as in FIG. 2 and any further detailed descriptions of the same elements will be omitted hereinafter.

Referring to FIG. 3, an additional separation pattern 39a may be further provided at a first end portion of the deep trench hole DTH around the first surface 11, e.g., the additional separation pattern 39a may be in the widest part of the deep trench hole DTH between the first surface 11 and the conductive pattern of the separation pattern. The device isolation layer 39 may be enclosed, e.g., surrounded along its perimeter, by the additional separation pattern 39a, and a first modified pixel separation pattern 40a may include the insulation pattern 41 and a first modified conductive pattern 45a filling the deep trench hole DTH above the additional separation pattern 39a.

The additional separation pattern 39a may include insulation materials for sufficiently isolating the unit pixel UP from its surroundings. Thus, the additional separation pattern may separate the neighboring unit pixels UP from each other together with the device isolation layer 39 and the insulation pattern 41.

For example, the additional separation pattern 39a may include a boundary surface BS that may be coplanar with the first surface 11 and may be positioned at a boundary area of the substrate 10, and an inner surface IS that may be positioned in the deep trench hole DTH opposite to the boundary surface BS, e.g., the inner surface IS may make contact with the first modified conductive pattern 45a. Thus, the additional separation pattern 39a may have a thickness (or a height) corresponding to a gap distance between the boundary surface BS and the inner surface IS in the deep trench hole DTH.

Particularly, the additional separation pattern 39a may be enclosed by the insulation pattern 41 in the deep trench hole DTH in such a configuration that the unit pixel UP may be enclosed by the additional separation pattern 39a. Thus, the signal generator 30 may be enclosed by the insulation pattern 41 and the additional separation pattern 39a as well as the device isolation layer 39, and thus the neighboring signal generator 30 adjacent to each other may be sufficiently insulated from each other.

The height of the first modified conductive pattern 45a may be controlled just by changing the thickness of the additional separation pattern 39a with reference to the device isolation layer 39. In the present example embodiment, the additional separation pattern 39a may have the thickness (or the height) greater than the device isolation layer 39. In such a case, the first modified conductive pattern 45a may fill up a hole space defined by the additional separation pattern 39a and the insulation pattern 41, and may extend from the inner surface IS to a second end portion of the deep trench hole around the second surface 12. Accordingly, the first modified conductive pattern 45a may have the thickness (or the height) smaller than that of the conductive pattern 45 in FIG. 2.

While the present example embodiment discloses that the thickness of the additional separation pattern 39a may be greater than that of the device isolation layer 39, the thickness of the additional separation pattern 39a may be smaller than or equal to that of the device isolation layer 39. That is, the thickness (or the height) of the first modified conductive pattern 45a may be controlled according to the characteristics and the requirements of the image sensor 90.

In the present example embodiment, the additional separation pattern 39a may include an oxide having good insulation and gap-fill characteristics. However, the additional separation pattern 39a may include any other materials as well as the oxide as long as the materials have sufficient insulation and gap-fill characteristics.

The signal interferences between neighboring signal generators 30 may be substantially minimized by the additional separation pattern 39a. Further, the layer uniformity of the first modified conductive pattern 45a may be sufficiently improved since the height of the first modified conductive pattern 45a may be reduced, thereby reducing the aspect ratio of the first modified conductive pattern 45a within the deep trench hole DTH, e.g., the height of the first modified conductive pattern 45a in the z direction may be reduced within a same deep trench hole DTH relative to a same width in the x direction due to the additional separation pattern 39a within the deep trench hole DTH.

Figure 4:
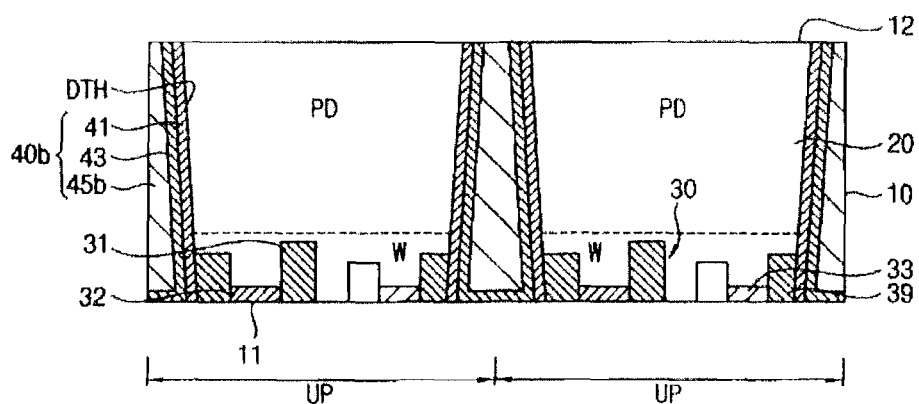
FIG. 4 illustrates a cross sectional view of a second modification of the image sensor in FIG. 2.

FIG. 4 is a cross sectional view illustrating a second modification of the image sensor in FIG. 2. In FIG. 4, the image sensor may have substantially the same structure as the image sensor in FIG. 2, except for the pixel separation pattern. Thus, in FIG. 4, same reference numerals denote the same elements as in FIG. 2 and any further detailed descriptions of the same elements will be omitted hereinafter.

Referring to FIG. 4, a second modified pixel separation pattern 40b may include the insulation pattern 41, a protection pattern 43, and a second modified conductive pattern 45b. The protection pattern 43 may be arranged on the insulation pattern 41 and may have a bottom surface coplanar with the first surface 11 of the substrate 10. Thus, the protection pattern 43 may be shaped into an inner surface profile of the deep trench hole DTH and may have a uniform thickness between the first surface 11 and the second surface 12. Particularly, when the insulation pattern 41 may have a uniform thickness between the first surface 11 and the second surface 12, the thicknesses of the insulation pattern 41 and the protection pattern 43 may also be uniform in the deep trench hole DTH. The second modified conductive pattern 45b may be filled in a space of the deep trench hole DTH that may be defined by the protection pattern 43, and thus the size of the second conductive pattern 45b may be smaller than that of the conductive pattern 45 shown in FIG. 2. As a result, the protection pattern 43 may be interposed between the second modified conductive pattern 45b and the insulation pattern 41.

The protection pattern 43 may protect the second surface 12 of the substrate 10 in a metal replacement process for forming the second modified conductive pattern 45b. Thus, the protection pattern 43 may include any materials that may be able to protect the substrate in the metal replacement process. For example, the protection pattern 43 may include any one material of silicon oxide, silicon nitride, and silicon oxynitride.

Particularly, when the protection pattern 43 may have a refractive index smaller than that of the substrate 10, the incident light R slanted with respect to the second surface 12 (hereinafter, refereed to slant light) may be refracted into the corresponding photoelectric converter 20 although the slant light may pass through the insulation pattern 41 and the refractive index of the second modified conductive pattern 45b may be greater than the substrate 10.

Figure 5:
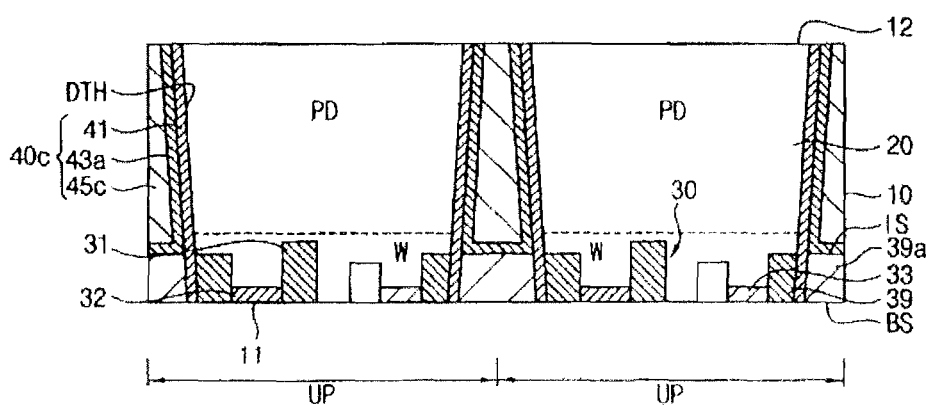
FIG. 5 illustrates a cross sectional view of a third modification of the image sensor in FIG. 2.

FIG. 5 is a cross sectional view illustrating a third modification of the image sensor in FIG. 2. In FIG. 5, the image sensor may have substantially the same structure as the image sensor in FIG. 2, except for the pixel separation pattern. Thus, in FIG. 5, same reference numerals denote the same elements as in FIG. 2 and any further detailed descriptions of the same elements will be omitted hereinafter.

Referring to FIG. 5, the third modified pixel separation pattern 40c may include the first modified protection pattern 43a in contact with the additional separation pattern 39a, the insulation pattern 41, and a third modified conductive pattern 45c.

For example, the first modified protection pattern 43a may contact the insulation pattern 41 in a vertical direction and contact the additional separation pattern 39a in a horizontal direction along a surface profile of the hole space defined by the additional separation pattern 39a and the insulation pattern 41. That is, the hole space may be further reduced by the first modified protection pattern 43a and the additional separation pattern 39a, and the insulation pattern 41 may be covered by the first modified protection pattern 43a. The third modified conductive pattern 45c may be filled in the hole space defined by the first modified protection pattern 43a. Accordingly, the deep trench hole DTH may be filled with the insulation pattern 41, the additional separation pattern 39a, the first modified protection pattern 43a, and the third modified conductive pattern 45c.

The additional separation pattern 39a may have substantially the same structures as the additional separation pattern shown 39a in FIG. 3, except that the inner surface IS of the additional separation pattern 39a in FIG. 5 contacts the first modified protection pattern 43a. The additional separation pattern 39a may be enclosed by the insulation pattern 41 in the deep trench hole DTH in such a configuration that the unit pixel UP may be enclosed by the additional separation pattern 39a. The first modified protection pattern 43a may be interposed between the third modified conductive pattern 45c and the insulation pattern 41 and between the third modified conductive pattern 45c and the additional separation pattern 39a.

Thus, the signal generator 30 may be enclosed by the device isolation layer 39, the insulation pattern 41, the first modified protection pattern 43a, and the additional separation pattern 39a, so that neighboring signal generators 30 adjacent to each other may be more sufficiently insulated from each other.

The first modified protection pattern 43a may have substantially the same structure as the protection pattern 43 except that the height of the first modified protection pattern 43a may be smaller than the height of the first protection pattern 43 in accordance with the height of the additional separation pattern 39a, i.e., the height difference between the first modified protection pattern 43a and the protection pattern 43 may equal the height of the additional separation pattern 39a. In the same way, the third modified conductive pattern 45c may have substantially the same structure as the second modified conductive pattern 45b in FIG. 4, except that the height of the third modified conductive pattern 45c may be smaller than the height of the second modified conductive pattern 45b in accordance with the height of the additional separation pattern 39a, i.e., the height difference between the third modified conductive pattern 45c and the second modified conductive pattern 45b may equal the height of the additional separation pattern 39a.

The substrate 10 may be protected from the metal replacement process for forming the second modified conductive pattern 45b by the first modified protection pattern 43a. In addition, the signal generator 30 may be enclosed by the insulation pattern 41 and the additional separation pattern 39a as well as the device isolation layer 39. Thus, neighboring signal generators 30 adjacent to each other may be sufficiently insulated from each other, thereby sufficiently minimizing the signal interferences between the neighboring unit pixels UP.

Further, since the aspect ratio of the hole space may be reduced by the additional separation pattern 39a and the insulation pattern 41, the first modified protection pattern 43a and the third modified conductive pattern 45c may have a reduced aspect ratio, e.g., the heights of the first modified protection pattern 43a and the third modified conductive pattern 45c may be reduced within the deep trench hole DTH. As a result, the uniformity of layer characteristics of the third modified conductive pattern 45c and the first modified protection pattern 43a may be much improved.

In other modified example embodiments, an air void may be further provided in the deep trench hole DTH so as to improve insulation characteristics of the unit pixel UP much more.

Figure 6A:
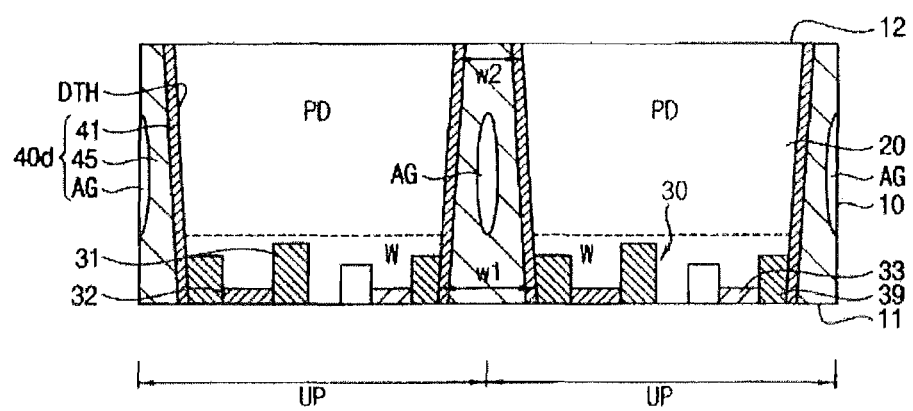
FIG. 6A illustrates a cross sectional view of a fourth modification of the image sensor in FIG. 2.

FIG. 6A is a cross sectional view illustrating a fourth modification of the image sensor in FIG. 2. In FIG. 6A, the image sensor may have substantially the same structure as the image sensor in FIG. 2, except for the pixel separation pattern. Thus, in FIG. 6A, same reference numerals denote the same elements as in FIG. 2 and any further detailed descriptions of the same elements will be omitted hereinafter.

Referring to FIG. 6A, a fourth modified pixel separation pattern 40d may include the insulation pattern 41 and the conductive pattern 45 in which an air gap AG may be provided. The insulation pattern 41 and the conductive pattern 45 may have substantially the same structures as those of the pixel separation pattern 40 in FIG. 2, except that the air gap AG may be arranged in the conductive pattern 45. The air gap may include at least a void in the conductive pattern 45 that may be filled with air. Thus, any detailed descriptions of the insulation pattern 41 and the conductive pattern 45 will be omitted hereinafter.

At least a void may be generated in the formation process of the conductive pattern 45 due to the high aspect ratio of the deep trench hole DTH, and air may be filled in the void, thereby forming the air gap AG in the conductive pattern 45. Thus, the insulation characteristics of the fourth modified pixel separation pattern 40d may be improved as much as, e.g., due to, the insulation degree of air, and the unit pixels UP may be more sufficiently separated from one another in the image sensor 90. That is, a cross talk defect between neighboring unit pixels UP may be minimized due to the air gap AG in the conductive pattern 45.

For example, the process conditions for forming the conductive pattern 45 (or the conductive layer 450a in FIG. 11I) may be controlled in such a way that at least one void may be generated in the conductive pattern 45 in the deep trench hole DTH. The size of the void may be determined by the process conditions and the aspect ratio of the deep trench hole DTH and may be formed as an air bubble.

Figure 6B:
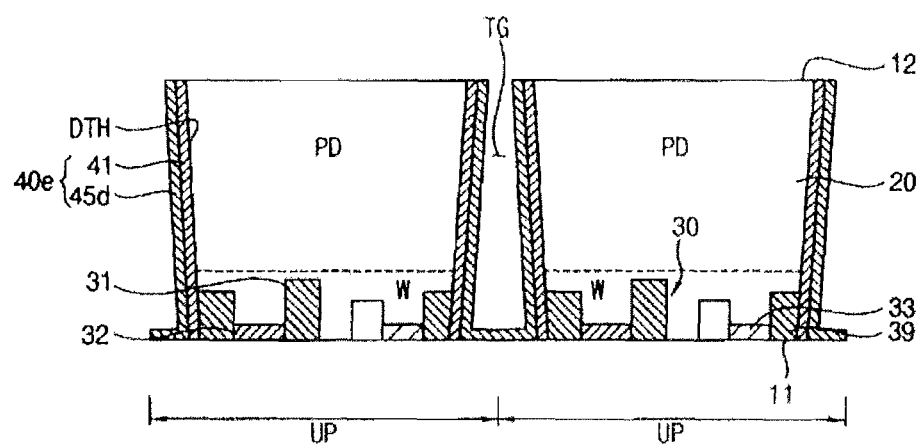
FIG. 6B illustrates a cross sectional view of a fifth modification of the image sensor in FIG. 2.

FIG. 6B is a cross sectional view illustrating a modification of the image sensor in FIG. 6A. In FIG. 6B, the image sensor may have substantially the same structure as the image sensor in FIG. 6A, except for the pixel separation pattern. Thus, in FIG. 6B, same reference numerals denote the same elements as in FIG. 6A and any further detailed descriptions of the same elements will be omitted hereinafter.

Referring to FIG. 6B, a fifth modified pixel separation pattern 40e may include the insulation pattern 41 and a conductive liner 45d covering the insulation pattern 41, so the rest of hole space, i.e., a remainder of the deep trench hole DTH, defined by the conductive liner 45d may be provided as a trench gap TG. That is, a void may extend into a line shape along the deep trench hole DTH, and the line-shaped void may be filled with air. That is, the line-shaped void filled with air may be provided as the trench gap TG in the deep trench hole DTH.

For example, conductive materials may be deposited, e.g., conformally, onto the insulation pattern 41 to a predetermined thickness by an accurately thickness controllable deposition process, e.g., an atomic layer deposition (ALP) process. Thus, a thin conductive layer may be formed on the insulation pattern 41 along a surface profile of the deep trench hole DTH just like a liner covering the insulation pattern 41, thereby forming the conductive liner 45d. Thus, the hole space of the deep trench hole DTH defined by the conductive liner 45d may be provided as the trench gap TG. In the present example embodiment, the insulation pattern 41 and the conductive liner 45d may have substantially the same thickness.

In the present example embodiment, the conductive liner 45d may be formed in the deep trench hole DTH in such a configuration that the first end portion around the first surface 11 may be closed by the conductive liner 45d and the second end portion around the second surface 12 may be open. Thereafter, the open second end portion of the deep trench hole DTH may be closed just by controlling the process conditions for forming a buffer layer 600 shown in FIG. 11K. Thus, the trench gap TG may be formed into a closed space filled with air. The unit pixel UP may be enclosed by the bulk air in the trench gap TG having a size much larger than the air gap AG in FIG. 6A, and the neighboring unit pixels UP may be sufficiently insulated from each other by the air in the trench gap TG. Accordingly, various noises caused by the dark current and the cross-talk defect may be sufficiently prevented due to the improved insulation characteristics of the fifth modified pixel separation pattern 40e.

Referring to FIG. 2 again, the wiring structure 50 may be arranged on the first surface 11 of the substrate 10. The wiring structure 50 may include a plug structure 53 and a metal wiring 51 that may be connected to the signal generator 30, and at least an insulation interlayer 52. A plurality of insulation interlayers 52 may be stacked on the first surface 11 of the substrate 10, and a plurality of the metal wirings 51 may be arranged on each insulation interlayer 52.

The metal wiring 51 may include a low resistive conductive metal. Examples of the low resistive conductive metal may include copper (Cu), tungsten (W), titanium (Ti), aluminum (Al), etc. Those may be used alone or in combinations thereof. For example, the wiring structure 50 may be formed by a wiring process for semiconductor devices, e.g., a back end of line (BEOL) process.

The buffer layer 60 may be arranged on the second surface 12 of the substrate 10. The buffer layer 60 may include a single layer or a multilayer structure. In the present example embodiment, the buffer layer 60 may include a metal oxide layer 61, an anti-reflection layer 62, and a passivation layer 63.

The metal oxide layer 61 may cure surface defects of the second surface 12, which may be generated in a substrate process for forming the second surface 12, thereby minimizing the noises caused by the surface defects of the second surface 12. The anti-reflection layer 62 may prevent the incident light R transmitting through the light transmitting unit 70 being reflected outwards from the unit pixel UP, thereby increasing the efficiency of the photoelectric converter 20. The passivation layer 63 may include, e.g., silicon oxide.

Since the pixel separation pattern 40 may penetrate through the substrate 10, the pixel separation pattern 40 may make contact with the buffer layer 60. While the present example embodiment discloses that the pixel separation pattern 40 may contact, e.g., directly, the metal oxide layer 61, the pixel separation pattern 40 may also be in contact with the anti-reflection layer 62 when the buffer layer 60 does not include the metal oxide layer 61.

The light transmitting unit 70 may be arranged on the buffer layer 60 and the incident light R may reach the photoelectric converter 20 through the light transmitting unit 70. For example, the light transmitting unit 70 may include a color filter 71 and a micro lens 73.

The color filter 71 may be arranged on the buffer layer 60 by the unit pixel UP and may filter the incident light by the wavelength, so that only a specific wavelength of the light corresponding to the color filter may be transmitted through the color filter 71 and reach the photoelectric converter 20. That is, a specific color of light may be transmitted through the corresponding color filter 71 and the color information of the object may be realized in each corresponding unit pixel UP. The incident light R may be focused to the unit pixel UP by the micro lens 73.

The color filter 71 may be arranged on the buffer layer 60 by the unit pixel UP, and thus, the color filter 71 and the unit pixel UP may have a one to one correspondence. Thus, a plurality of the color filters 71 may be provided as a color filter array in a matrix shape corresponding to the pixel matrix. For example, the color filter array may include a Bayer pattern having a red filter, a green filter and a blue filter.

The micro lens 73 may be arranged on the color filter 71 by the unit pixel UP. The micro lens 73 may change the path of the incident light R in such a way that the incident light R may be focused onto the photoelectric converter 20 in each unit pixel UP. A plurality of the micro lenses 73 may be provided as a micro lens array in a matrix shape corresponding to the pixel matrix.

According to the above example embodiment of the image sensor 90, the conductive pattern 45 including a low resistive metal may be provided in the pixel separation pattern 40 and the negative bias may be applied to the conductive pattern 45. Thus, the dark currents on the boundary surface between the photoelectric converter 20 and the pixel separation pattern 40 may be efficiently removed in the unit pixel UP. In the conventional image sensor, since the conductive pattern may include a relatively high resistive polysilicon, the negative bias may not be applied stably to the conductive pattern of the pixel separation pattern, which usually gives rise to the noise defects caused by the dark currents in the image sensor. In contrast, in example embodiments, the noise defects caused by the dark currents may be sufficiently reduced or prevented by the replacement of the polysilicon of the conventional conductive pattern with the low resistive metal of the present conductive pattern 45 in the image sensor 90.

Particularly, the conductive pattern 45 may include a material having a refractive index smaller than that of the substrate, and thus the slant light, i.e., incident at an oblique angle, may be refracted into the corresponding photoelectric converter 20. In addition, the conductive pattern 45 may include transparent conductive oxide (TCO) having good total reflection characteristics, and thus the incident light R may be totally reflected from the TCO into the unit pixel UP although some of the incident light R may transmit through the insulation pattern 41, thereby increasing the efficiency of the photoelectric converter 20 and minimizing the light interference between the neighboring unit pixels UP.

Further, the pixel separation pattern 40 may be shaped into a trapezoid in which the width may decrease from the first surface 11 on which the wiring structure 50 is arranged toward the second surface 12 on which the buffer layer 60 is arranged. Since the second surface 12 may correspond to a back side or a rear surface of the substrate 10 and the incident light R may be incident onto the second surface 12, the image sensor 90 may be configured into a back side illumination (BSI) structure and the trapezoidal pixel separation pattern 40 may enlarge the receipt area of the incident light R, thereby increasing the efficiency of image sensor 90.

Hereinafter, an image sensor module having the image sensor 90 will be described in detail hereinafter with reference to FIGS. 7 to 10.

Figure 7:
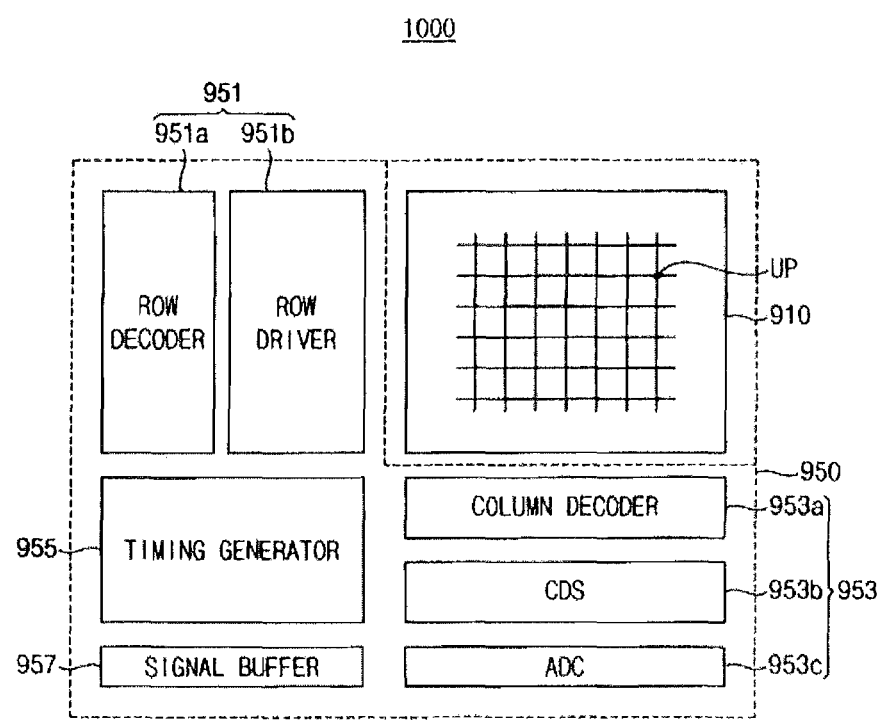
FIG. 7 illustrates a block diagram of an image sensor module in accordance with an example embodiment.
Figure 8:
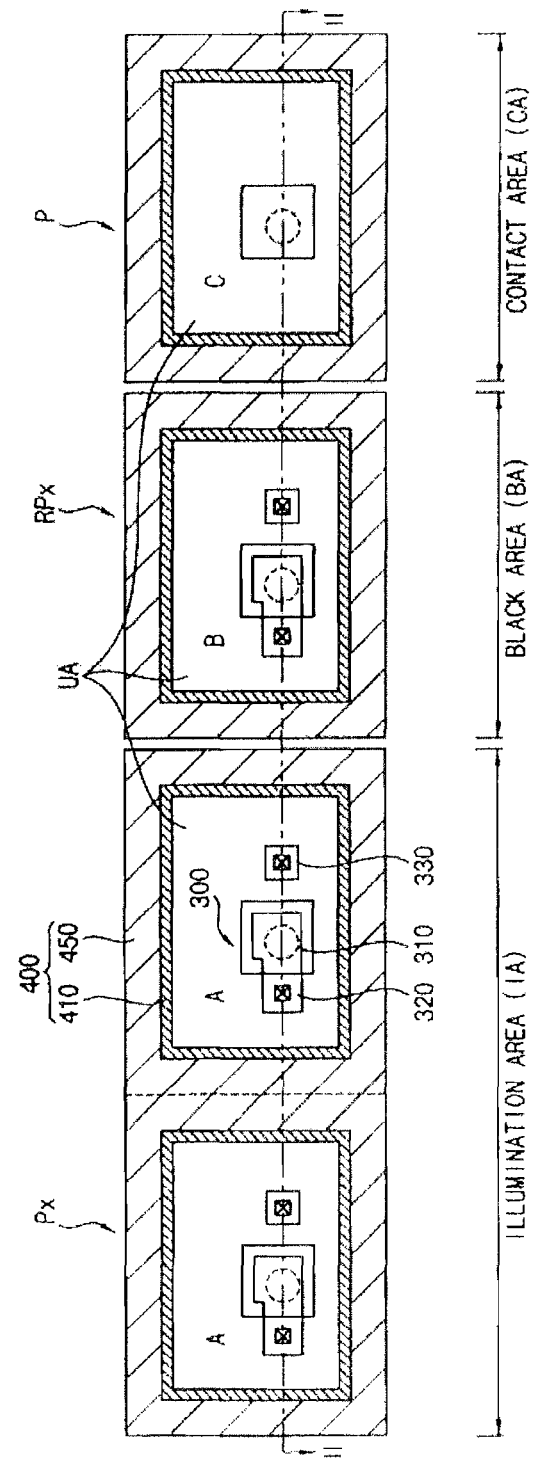
FIG. 8 illustrates a plan view of the image sensor of the image sensor module in FIG. 7.
Figure 9:
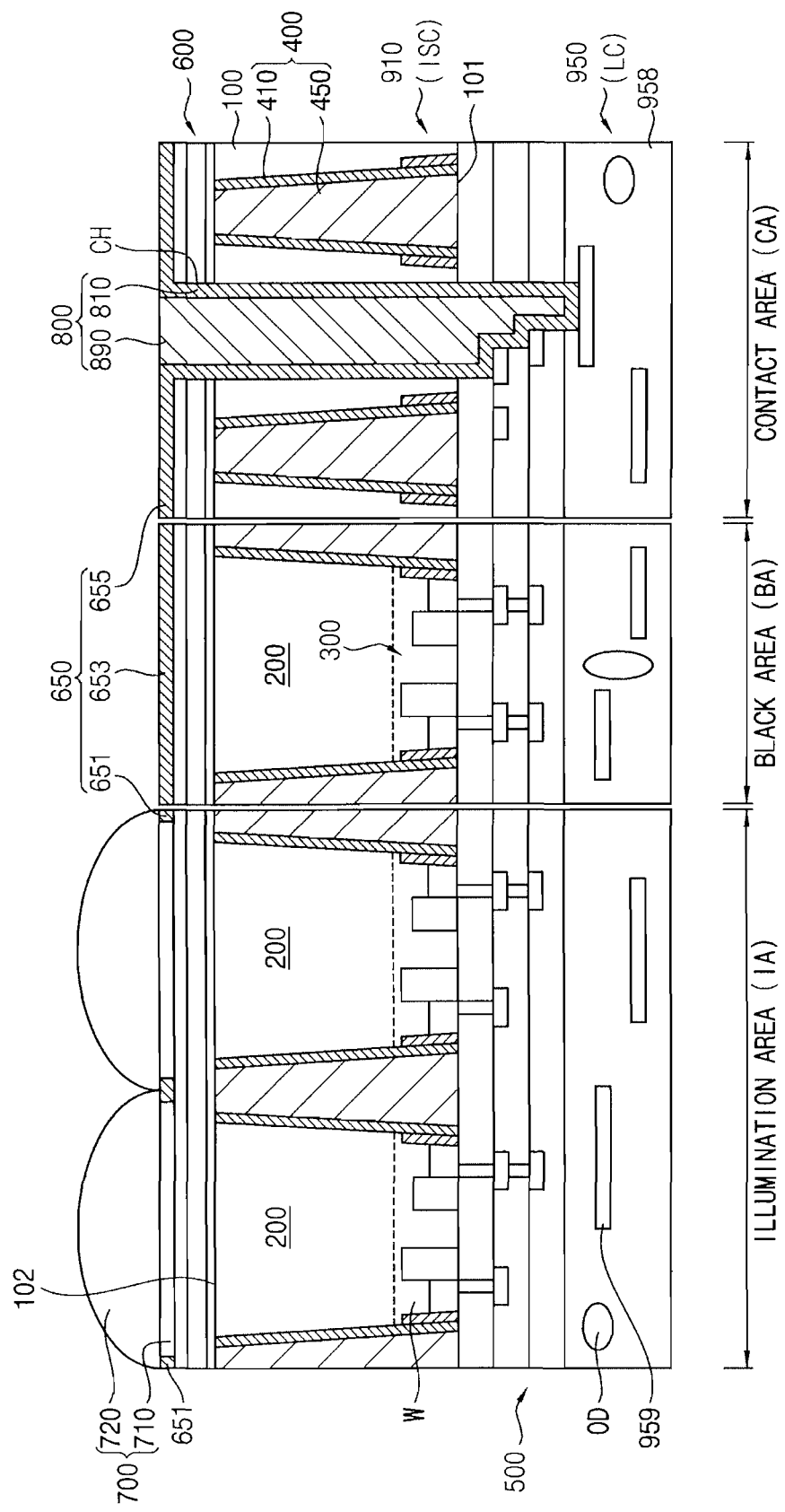
FIG. 9 illustrates a cross sectional view along line I-I' in FIG. 8.
Figure 10:
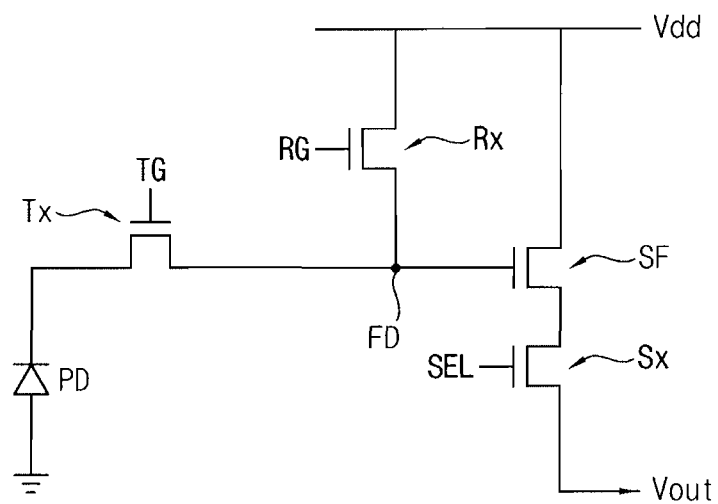
FIG. 10 illustrates a circuit diagram of a unit pixel of the image sensor in FIG. 8.

FIG. 7 is a block diagram of an image sensor module 1000 in accordance with an example embodiment, and FIG. 8 is a plan view illustrating an image sensor 910 of the image sensor module 1000. FIG. 9 is a cross sectional view along line I-I' in FIG. 8, and FIG. 10 is a circuit diagram of a unit pixel of the image sensor 910.

Referring to FIGS. 7 to 9, the image sensor module 1000 in accordance with an example embodiment may include the image sensor 910 generating image information of an object in response to an incident light and an image signal processor (ISP) 950 generating image data of the object from the image information generated from the image sensor 910.

For example, the image sensor 910 may include an image pixel unit Px, a reference pixel unit RPx, and a connector unit P that may be arranged on an illumination area IA, a black area BA, and a contact area CA of a substrate 100, respectively. The image pixel unit Px may include the image sensor 90 described in detail with reference to FIGS. 1 to 6B in such a configuration that a plurality of the unit pixels UP may be arranged on the illumination area IA of the substrate 100. The image pixel unit Px may be arranged at a central portion of the substrate 100 and may generate a plurality of the photoelectrons in response to the incident light. The reference pixel unit RPx may be arranged on the black area BA at a peripheral area of the substrate 100, and the connector unit P may be arranged on the contact area CA at a pad area of the substrate 100.

The substrate 100 may include a semiconductor substrate having at least one layer. A front surface of the substrate 100 may be provided as a first surface 101 of the substrate 100 and a rear surface or a back-side surface of the substrate 100 may be provided as a second surface 102 of the substrate 100.

The substrate 100 may be divided into a plurality of uniform unit areas UA by a deep trench hole DTH. The unit areas UA in the illumination area IA may be provided as a pixel area A for generating photoelectrons in response to the incident light, and the unit areas UA of the black area BA may be provided as a reference cell area B for generating reference charges for comparing with the photoelectrons in the illumination area IA. The unit area UA of the contact area CA may be provided as a contact margin area C in which the connector unit P may be sufficiently positioned. The deep trench hole DTH may be filled with a pixel separation pattern 400 described in detail hereinafter, and thus, each unit area UA may be enclosed by the pixel separation pattern 400 and may be insulated from an adjacent unit area UA by the pixel separation pattern 400. Each of the unit areas UA of the pixel area A and the reference cell area B may include a photoelectric converter 200 for generating the photoelectrons in response to the incident light and a signal generator 300 for generating electric signals according to the photoelectrons. Thus, each unit area UA of the pixel area A and the reference cell area B may be provided as a unit pixel UP of the image sensor 910. A plurality of the unit pixels UP may be arranged on the central and peripheral areas of the substrate in a matrix shape.

At least one photoelectric converter 200 may be arranged in the unit pixel UP and may generate the photoelectrons in response to the incident light. For example, the photoelectric converter 200 may include a photo diode, a photo transistor and a photo gate, a pinned photo diode (PPD), etc. For example, the photoelectric converter 200 may be positioned deep in the unit pixel UP in such a configuration that the photoelectric converter 200 may be positioned around the second surface 102 onto which the light may be incident. In addition, the unit pixel UP may be shaped into a reverse trapezoid since the pixel separation pattern 400 may be shaped into a trapezoid, so the light receipt area of the photoelectric converter 200 may be enlarge in the image sensor 910.

The signal generator 300 may be arranged at surface portions of the first surface 101 of the substrate 100 at each unit pixel UP, and may generate the electric signals based on the photoelectrons in the photoelectric converter 200. The electric signals may include image information about the object. A well area W may be interposed between the photoelectric converter 200 and the first surface 101 of the substrate 100, and impurities having a semiconductor type different from the photoelectric converter 200 may be implanted onto the surface portions of the well area W, thereby forming active regions on the first surface 101 of the substrate 100. The active region on the well area W may be defined by a device isolation layer, and the signal generator 300 may be arranged on the active regions in the well area W.

The signal generator 300 may include a transfer transistor 310, a floating diffusion node 320, and at least a signal transistor 330. The transfer transistor 310 may transfer the photoelectrons to the floating diffusion node 320 from the photoelectric converter 200, and a plurality of the photoelectrons may be accumulated at the floating diffusion node 320. The signal transistor 330 may be connected to the floating diffusion node 320 and may generate the electric signals corresponding to the potential difference or the voltage of the accumulated photoelectrons in the floating diffusion node 320.

Referring to FIG. 10, in the present example embodiment, the signal transistor 330 may include a reset transistor Rx for discharging the photoelectrons from the floating diffusion node 320, a source follower transistor SF for amplifying the voltage of the floating diffusion node 320, and a selection transistor Sx for detecting the amplified voltage of the floating diffusion node 320 in response to a selection signal. The floating diffusion node 320 (i.e., floating diffusion node FD in FIG. 10) may be connected to a source electrode of the reset transistor Rx and simultaneously connected to a gate electrode of the source follower transistor SF. The source follower transistor SF may be connected to the selection transistor Sx.

The photoelectric converter 200 and the signal generator 300 may have substantially the same structures as the photoelectric converter 20 and the signal generator 30 of the image sensor 90 in FIGS. 1 and 2, respectively. Thus, any detailed descriptions of the photoelectric converter 200 and the signal generator 300 are omitted.

The contact margin area C may be provided as a process margin area for a process for forming the contact unit P. Therefore, the photoelectric converter 200 and the signal generator 300 may not be arranged in the contact margin area C.

The pixel separation pattern 400 defining the unit areas UA may penetrate through the substrate 100 and may be provided as a penetration structure making contact with both of the first surface 101 and the second surface 102. In the present example embodiment, the pixel separation pattern 400 may include an insulation pattern 410 having a refractive index smaller than that of the substrate 100 and a metallic conductive pattern 450 filling into the insulation pattern 410.

The pixel separation pattern 400 may function as a pixel separation pattern for separating the unit pixels UP individually in the illumination area IA and the black area BA of the substrate 100, and may function as a size factor for determining the size of the contact margin area C in the contact area CA of the substrate 100. That is, each of the unit areas UA of the substrate 100 may be separated and isolated from one another by the pixel separation pattern 400.

In the present example embodiment, the insulation pattern 410 may be provided as a sidewall liner covering a sidewall or an inner side surface of the deep trench hole DTH, and the conductive pattern 450 may fill up the deep trench hole DTH together with the insulation pattern 410. Thus, the conductive pattern 450 may be enclosed with the insulation pattern 410 in the deep trench hole DTH.

The insulation pattern 410 may include an oxide, e.g., silicon oxide ($SiO_2$) having a refractive index smaller than that of the substrate 100 and the conductive pattern 450 may include a low resistive metal, e.g., titanium nitride (TiN), tantalum nitride (TaN), tungsten (W), copper (Cu), etc.

Those may be used alone or in combinations thereof. Thus, the conductive pattern 450 may function as an efficient electrode for the negative bias.

Particularly, the conductive pattern 450 may be formed on the second surface 102 by the metal replacement process as will be described in detail hereinafter. Thus, the signal generator 300, which may be arranged on surface portions of the first surface 101, may be sufficiently protected from the metal replacement process, and the damages to the signal generator 300 in the process for forming the conductive pattern 450 may be sufficiently prevented or minimized. In addition, since the negative bias may be stably applied to the conductive pattern 450, the dark currents may be sufficiently reduced or removed from the boundary surface between the insulation pattern 410 and the photoelectric converter 200.

In a modified example embodiment, the conductive pattern 450 may include transparent conductive oxide (TCO) having good total reflection characteristics. Thus, the incident light R may be totally reflected from the TCO into the unit pixel UP although the incident light R may transmit through the insulation pattern 410, thereby increasing the efficiency of the photoelectric converter 200 and minimizing the light interference between the neighboring unit pixels UP.

In the present example embodiment, the pixel separation pattern 400 may be shaped into a trapezoid of which the width may decrease from the first surface 110 to the second surface 120. Thus, the surface area of the unit area UA may increase from the first surface 101 to the second surface 102, and the pixel separation pattern 400 may be shaped into a hollow truncated pyramid enclosing the unit area UA of the substrate 100. Particularly, the surface area increase of the unit pixel UP at the illumination area IA and the black area BA may cause the increase of the light receipt area. Thus, the photo sensitivity and efficiency of the photoelectric converter 200 may be sufficiently improved by the reverse trapezoidal shape of the unit pixel UP.

The pixel separation pattern 400 may further include a protection pattern for covering the insulation pattern 410. In such a case, the insulation pattern 410, the protection pattern, and the conductive pattern 450 may have a uniform or a non-uniform thickness.

The pixel separation pattern 400 may have substantially the same structure as the pixel separation pattern 40, and the first, the second, and the third modified pixel separation patterns 40a to 40c that are described in detail with reference to FIGS. 1 to 5. Thus, further detailed descriptions of the pixel separation pattern 400 are omitted.

A wiring structure 500 may be arranged on the first surface 101 of the substrate 100 and a buffer layer 600 may be arranged on the second surface of the substrate 100.

The wiring structure 500 may include a conductive line connected to the signal generator 300, at least one plug, at least one metal wiring, and an interlayer insulation layer covering the conductive line and insulating the conductive line. The buffer layer 600 may include a metal oxide layer, an anti-reflection layer, and a passivation layer. Since the pixel separation pattern 400 may penetrate through the substrate 100, the pixel separation pattern 400 may make contact with the buffer layer 600. The wiring structure 500 and the buffer layer 600 may have substantially the same structures as the wiring structure 50 and the buffer layer 60 as described in detail with reference to FIGS. 1 and 2, respectively, so any further detailed descriptions of the wiring structure 500 and the buffer layer 600 are omitted.

A low resistive cover layer 650 may be arranged on the buffer layer 600. The cover layer 650 may include conductive materials having low electrical resistance.

The cover layer 650 in the illumination area IA may be arranged on the buffer layer 600 corresponding to the pixel separation pattern 400, and the pixel area A may be enclosed by the cover layer 650. That is, the cover layer 650 in the illumination area IA may function as a grid pattern 651 for reflecting the slant light that may be obliquely irradiated to a peripheral portion of the unit pixel UP to the photoelectric converter 200 in the unit pixel UP. For example, as illustrated in FIG. 9, the grid pattern 651 in the illumination area IA may have a grid shape in top view that is positioned on the pixel separation pattern 400 to overlap top surfaces of the conductive pattern 450, e.g., and expose the photoelectric converter 200 and the insulation pattern 410.

The cover layer 650 in the black area BA may be arranged on the buffer layer 600 across the whole black area BA, e.g., continuously covering the entire buffer layer 600 in the black area BA, so the light that may be irradiated onto the reference pixel unit RPx may be sufficiently blocked in such a way that minimal light may reach the reference pixel unit RPx. Thus, the cover layer 650 in the black area BA may function as an optical block pattern 653. The photoelectrons generated from the reference pixel unit RPx in response to the minimal light may be provided as a reference charge or a reference voltage for the photoelectrons generated from the pixel unit Px. When the pixel unit Px generates photoelectrons greater than the reference charges, the pixel unit Px may be classified into an active pixel, and when the pixel unit Px generates photoelectrons smaller than the reference charges, the pixel unit Px may be classified into an inactive pixel in the illumination area IA of the substrate 100.

The cover layer 650 in the contact area CA may function as a contact pad 655 for a contact structure 800. A contact hole CH may penetrate through the contact pad 655, the buffer layer 600, the substrate 100, and the wiring structure 500, and the contact structure 800 may fill up the contact hole CH.

The contact structure 800 may include a contact extender 810 arranged on the inner surface and bottom of the contact hole CH, and may be connected to the contact pad 655 on the buffer layer 600. The contact structure 800 may further include an insulation column 890 filling up the contact hole CH on the contact extender 810, e.g., insulation column 890 may be enclosed by the contact extender 810. Thus, a first end portion of the contact extender 810 around the first surface 101 may contact the wiring structure 500 and the ISP 950, and a second end portion of the contact extender 810 around the second surface 102 may contact the contact pad 655. In the present example embodiment, the contact extender 810 may be simultaneously formed with the cover layer 650, so that the contact extender 810 and the contact pad 655 may be integrally formed, e.g., continuously as a single layer, with each other in one body.

Particularly, the contact structure 800 may be positioned at the contact margin area C defined by the pixel separation pattern 400 in the contact area C of the substrate 100. Thus, the formation process for forming the contact structure 800 may be conducted with a sufficient process margin, thereby increasing the reliability of the contact structure 800. In addition, the contact structure 800 may be separated from another contact structure by the pixel separation pattern 400, thereby preventing electrical interference between the contact structure 800 and a neighboring contact structure.

While the present example embodiment discloses that the contact hole CH may be filled with the insulation column 890 and the contact extender 810, no insulation column may be provided with the contact hole CH and a void enclosed with the contact extender 810 may be provided in a central portion of the contact hole CH. In such a case, the contact extender 810 facing each other in the contact hole CH may be insulated from each other by air filling up the void.

A light transmitting unit 700 may be arranged on the buffer layer 600 in the pixel area A. The light transmitting unit 700 may include a color filter 710 covering the buffer layer 600 defined by the grid pattern 651 at each unit pixel UP and a micro lens 730 arranged on the color filter 710 and focusing the incident light onto the unit pixel UP. The color filter 710 may filter the incident light by the wavelength and the micro lens 730 may change the path of the incident light toward the photoelectric converter 200.

The light transmitting unit 700 may have substantially the same structures as the light transmitting unit 70 of the image sensor 90 as described in detail with reference to FIGS. 1 and 2. Thus, any detailed descriptions on the light transmitting unit 700 are omitted.

The electric signals corresponding to the image of an object (sometimes referred to as image signal) may be generated form the unit pixel UP by the following mechanism.

Referring to FIGS. 7 and 10, at first, the image sensor 910 may be set to be a black state, in which the light may be blocked from reaching the unit pixel UP, and each unit pixel UP may not be exposed to the light. Then, the reset transistor Rx (part of element 330 in FIG. 8) may be turned on under a standby state when a power voltage VDD is applied to the drain electrode of the reset transistor Rx and the drain electrode of the source follower transistor SF (part of element 330 in FIG. 8). Accordingly, most of the charges in the floating diffusion node FD (element 320 in FIG. 8) may be removed and the floating diffusion node FD may be fully discharged in each unit pixel UP.

When the floating diffusion node FD is sufficiently discharged, the reset transistor Rx may be turned off. In such a case, the photoelectrons may be generated in the photoelectric converter 200 in response to the incident light and may be transferred to the floating diffusion node FD. When the incident light reflected from an object may be incident onto the photoelectric converter 200 having a PN junction photo diode, a pair of electron-hole may be generated in the photoelectric converter 200. That is, the photoelectrons may be generated in the photoelectric converter 200 as the holes and the electrons. The hole may be accumulated in the P type area of the photo diode and the electrons may be accumulated in the N type area of the photo diode. The electrons in the N type area of the photo diode may be transferred to the floating diffusion node FD by the transfer transistor Tx (element 310 in FIG. 8), so the electrons or the photoelectrons may be accumulated in the floating diffusion node FD.

A gate bias of the source follower transistor SF may be changed in accordance with the amount of the photoelectrons in the floating diffusion node FD and the electric potential of the source electrode of the source follower transistor SF may be changed. In such a case, the selection transistor Sx (part of element 330 in FIG. 8) may be turned on and the electric potential or the voltage of the floating diffusion node FD may be detected as the electric signal Vout via a column line.

Particularly, since the pixel area A in which the photo diode may be arranged may be enclosed by the pixel separation pattern 400, the electrons may be trapped on the boundary surface between the pixel separation pattern 400 and the photo diode. However, since the conductive pattern 450 of the pixel separation pattern 400 may include the low resistive metal, the negative bias may be well applied to the conductive pattern 450 stably and as a result, the charge trap at the boundary surface of the separation pattern may be sufficiently prevented in each unit pixel UP. Therefore, the dark currents may be sufficiently minimized in each unit pixel UP.

The electric signals generated from the image sensor 910 may be transferred to the ISP 950 for generating image data of the object. The ISP 950 may include an operating driver 951 for applying operating signals to the image sensor 910, a signal detector 953 for detecting the electric signals (the image signals) from the image sensor 910 as detection signals, and a timing generator 955 for selectively controlling the operating signals and the detection signals. A signal buffer 957 for temporarily storing the detection signals may be further provided with the image sensor module 1000.

Each unit pixel UP of the image sensor 910 may be activated by the operating signals such as a pixel selection signal, a reset signal, and a charge transfer signal. The image signals of each unit pixel UP may be detected as analogue signals by a column decoder 953a and a correlated dual sampler (CDS) 953b of the signal detector 953.

The operating driver 951 may include a row decoder 951a for selecting a driving row of the unit pixels UP that may be arranged in the matrix shape (pixel matrix) and a row driver 951b for transferring the operating signals to the driving row. Thus, the operating signals may be simultaneously transferred to a plurality of the unit pixels UP on the same row of the pixel matrix.

The signal detector 953 may detect the electric signals from each unit pixel UP of the image sensor 910. For example, the signal detector 953 may include the column decoder 953a for selecting a reading column of the pixel matrix, the CDS 953b, and an analogue-to-digital converter 953c for converting the analogue signals to the digital signals.

The CDS 953b may detect a cell voltage indicating the electric potential of the photoelectrons in the pixel unit Px and a reference voltage indicating the electric portion of the photoelectrons in the reference pixel unit RPx, and may conduct the correlated dual sampling process. The CDS 953b may extract effective signals of the pixel units Px by the correlated dual sampling process and may select the effective signals as analogue sampling signals corresponding to the effective pixel units Px. The CDS 953b may include a plurality of CDS circuits each of which may be connected to each reading column of the pixel matrix and may detect the analogue sampling signals by the reading column. Then, the analogue sampling signals may be converted into the digital signals by the ADC 953c.

The timing generator 955 may provide timing signals to the row decoder 951a and the column decoder 953a, and may control the driving row to which the operating signals may be applied and the reading column from which the electric signals may be detected.

The signal buffer 957 may temporarily store the digital image (electric) signals from detected by the signal detector 953 and may sequentially transfer the digital image signals to a video signal processor in a decoding order of the column decoder 953a.

In the present example embodiment, the image sensor 910 may be provided on the substrate 100 and the ISP 950 may be provided on another substrate different from the substrate 100. Thus, the image sensor 910 and the ISP 950 may be connected to each other by the contact structure 800.

Figure 11A:
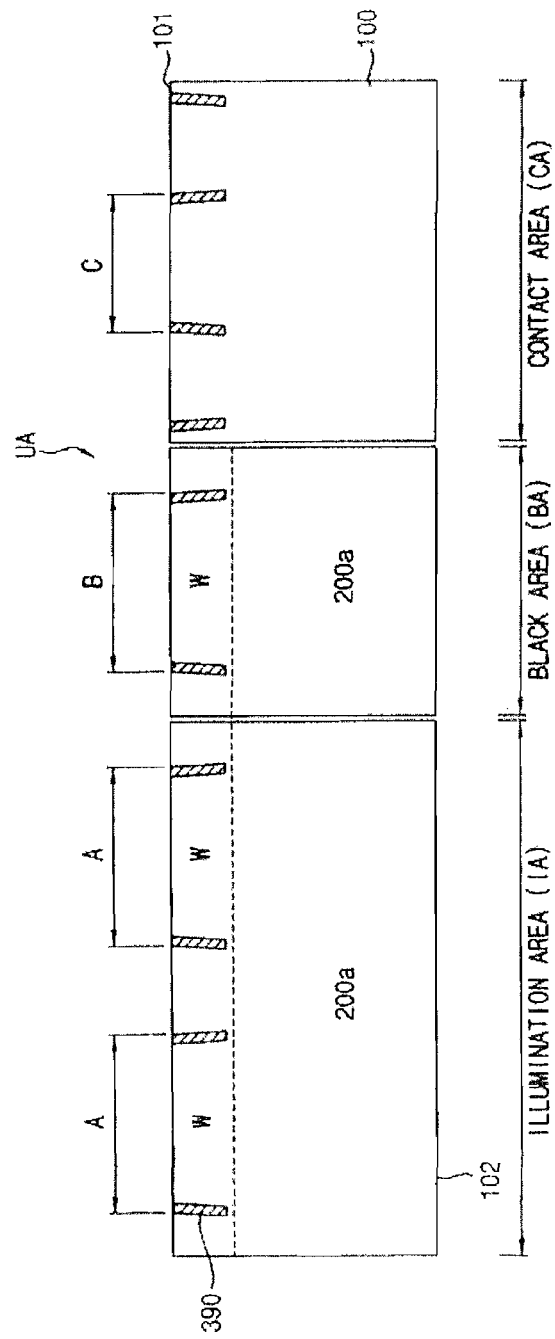
FIGS. 11A to 11O illustrate cross sectional views of stages in a method of manufacturing the image sensor module in FIG. 9.
Figure 11B:
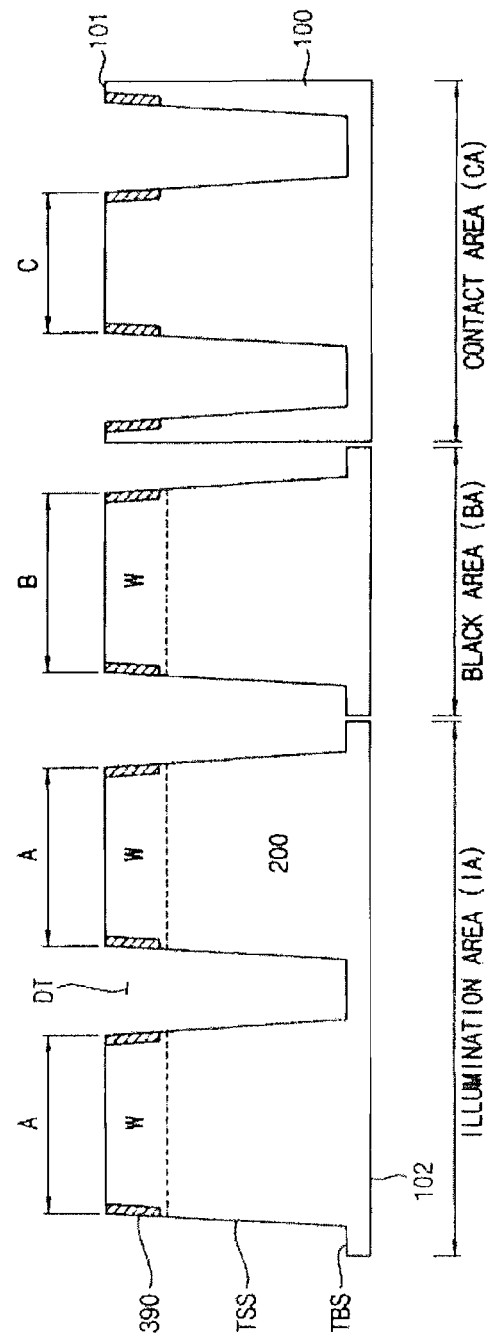
Figure 11C:
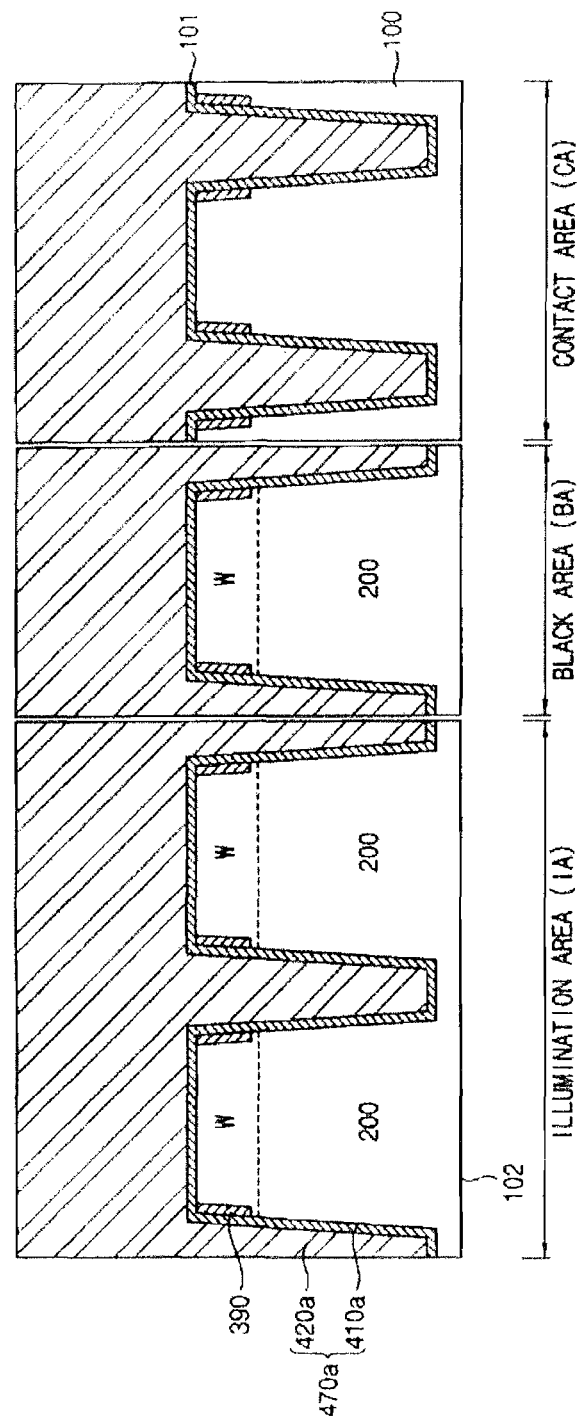
Figure 11D:
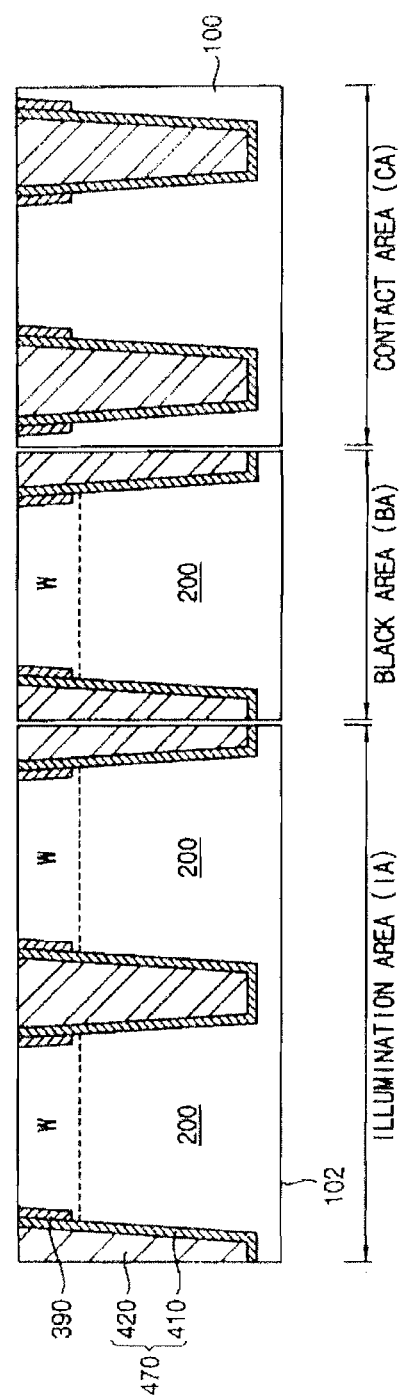
Figure 11E:
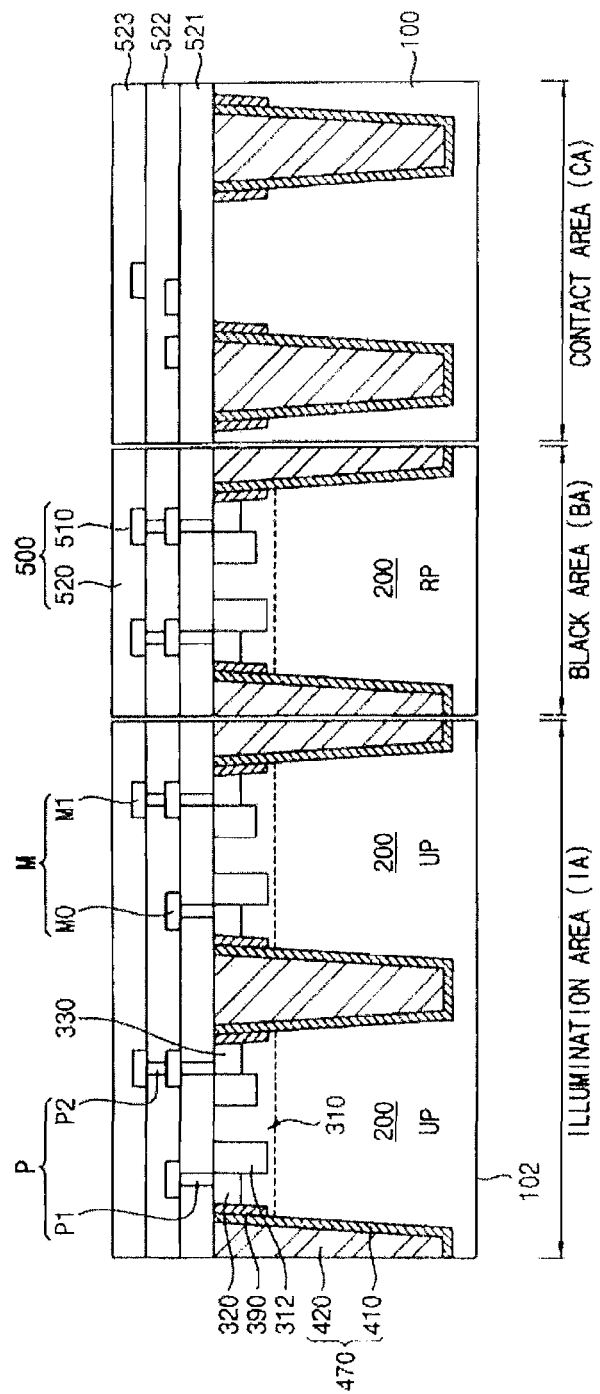
Figure 11F:
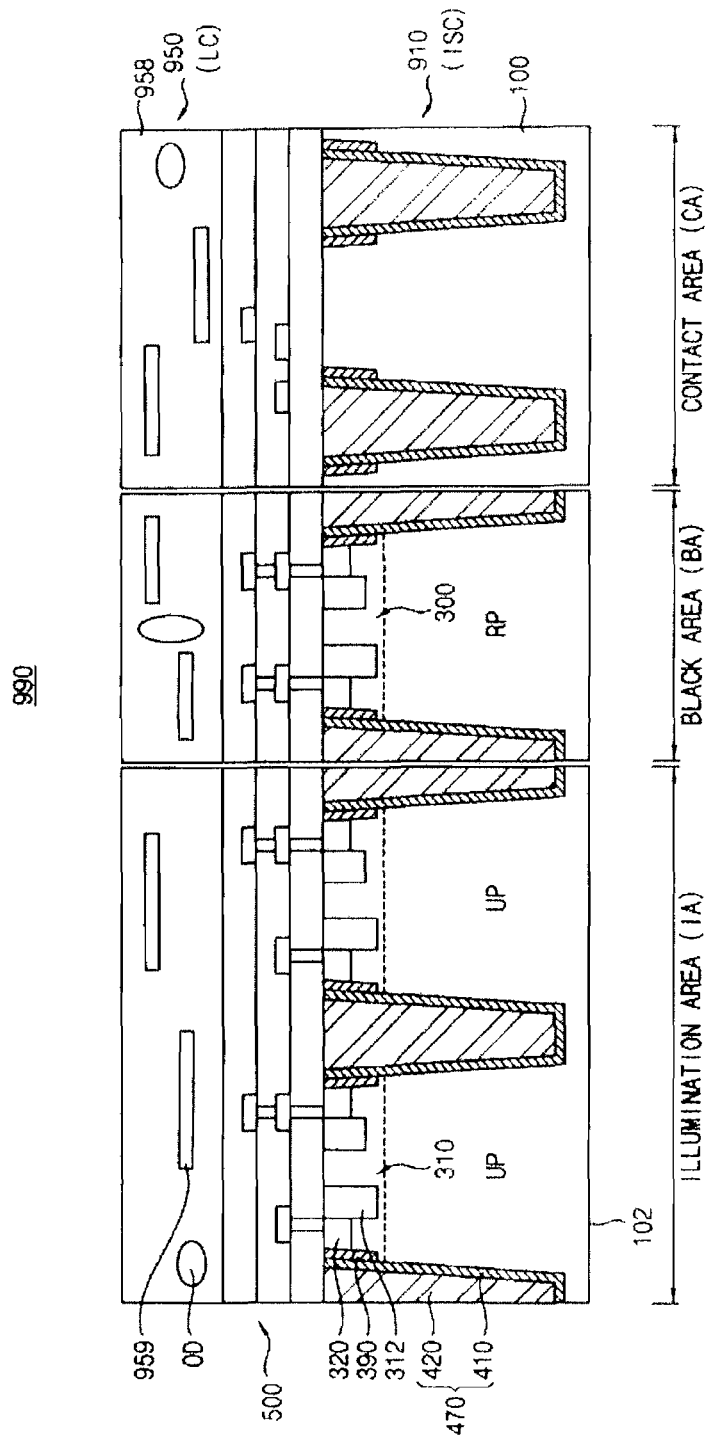

For example, the image sensor 910 may be provided on the substrate 100 as an individual image sensor chip ISC in FIG. 11F and the ISP 950 may be provided on an additional substrate 958 as a logic chip LC in FIG. 11F. That logic chip LC and the image sensor chip ISC may be electrically connected to each other by the contact structure 800. The image sensor chip ISC and the logic chip LC may be bonded to each other by a chip scaling process, and the wiring structure 500 of the image sensor chip ISC may be connected to an additional wiring structure 959 of the logic chip LC by the contact structure 800, s will be described with reference to FIG. 11F. For example, the contact structure 800 may include a through-silicon via (TSV) structure.

For example, the operating driver 951, the signal detector 953, the timing generator 955, and the signal buffer 957 may be arranged on the additional substrate 958 (FIG. 11F) and may be electrically connected with one another by the additional wiring structure 959. In such a case, the contact structure 800 may be arranged in the contact margin area C that may have a sufficient size for preventing the electrical interferences between the neighboring contact structures 800.

Particularly, since the pixel separation pattern 400 may be shaped into a trapezoidal shape, the contact margin area C may have a larger surface area at the second surface 102 than the first surface 101. Since the etching process for forming the contact hole CH may be conducted on the second surface 102 of the substrate 100, the process margin for the etching process may be sufficiently provided due to the reverse trapezoidal shape of the contact margin area C.

While the present example embodiment discloses that the image sensor 910 and the ISP 950 may be individually provided with different substrate, the image sensor 910 and the ISP 950 may also be provided on the same substrate. In such a case, the contact structure 800 may not be needed in the image sensor module 1000.

According to the present example embodiment of the image sensor module 1000, the conductive pattern 450 of the pixel separation pattern 400 may include a low resistive metal, and thus the negative bias may be stably applied to the conductive pattern 450. Therefore, the unstable appliance of the negative bias due to the relatively high resistance of polysilicon may be minimized and as a result the dark currents may be efficiently removed in the image sensor module 1000.

Further, the pixel separation pattern 400 may be shaped into a trapezoid in which the width may decrease from the first surface 101 on which the wiring structure 500 may be arranged to the second surface 102 on which the buffer layer 600 may be arranged. Since the second surface 102 may correspond to a back side or a rear surface of the substrate 100, and the incident light may be irradiated onto the second surface 102, the image sensor 910 may be configured into a back side illumination (BSI) structure and the trapezoidal pixel separation pattern 400 may enlarge the receipt area of the incident light, thereby increasing the efficiency of image sensor module 1000.

Hereinafter, the method of manufacturing the image sensor 910 will be described in detail with reference to FIGS. 11A to 13C.

FIGS. 11A to 11O are cross sectional views illustrating stages in a method of manufacturing the image sensor module 1000 in FIGS. 7 to 10.

Referring to FIG. 11A, an ion implantation process may be conducted on the substrate 100 having the illumination area IA, the black area BA, and the contact area CA, thereby forming the well areas W, and the photoelectric converter layers 200a in the illumination area IA and the black area BA of the substrate 100.

The substrate 100 may include the first surface 101 to which the ion implantation process may be conducted and the second surface 102 opposite to the first surface 101. For example, the substrate 100 may include a bulk silicon substrate having a p-type well doped with p-type impurities and a semiconductor substrate having the p-type bulk silicon substrate and a p-type epitaxial layer on the p-type bulk silicon substrate.

The plurality of unit areas UA may be arranged on the substrate 100. For example, the plurality of pixel areas A may be arranged on the illumination area IA of the substrate 100 in a matrix shape. The matrix of the pixel areas A is referred to as pixel matrix. A plurality of reference pixel areas B may be arranged on the black area BA of the substrate 100 along each row or each column of the pixel matrix. At least a contact margin area C may be arranged on the contact area CA of the substrate 100 in consideration of the process margin for forming the contact structure 800. Thus, the unit areas UA may include the pixel areas A, the reference pixel areas B, and the contact margin area C.

An incident light may be irradiated on the illumination area IA and the photoelectrons may be generated in response to the incident light as pixel charges. The incident light may be blocked in the black area BA and minimal light may be irradiated to the black area BA. Thus, the photoelectrons may be generated in response to the minimal light as reference charges. The reference charges may be provided as a reference value to the pixel charges. The contact structure 800 may be formed on the contact area CA of the substrate 100.

A mask pattern may be formed on the substrate 100 in such a way that the illumination area IA and the black area BA may be exposed, and the contact area CA may be covered by the mask pattern. Thereafter, the ion implantation process may be conducted on the substrate 100 using the mask pattern as an ion implantation mask.

For example, since the p-type well area W may be formed at surface portions of the first surface of the substrate 100, a plurality of n-type impurities may be doped into the substrate under the well area W, thereby forming an n-type dopant layer under the well area W in the illumination area IA and the black area BA of the substrate 100. Therefore, the n-type dopant layer and the p-type well area W may be formed into a PN junction diode and a photoelectric converter layer 200a may be formed in the illumination area IA and the black area BA of the substrate 100.

While the present example embodiment discloses that the photoelectric converter layer 200a is formed prior to the pixel separation pattern 400, the pixel separation pattern 400 may also be formed prior the photoelectric converter layer 200a.

Then, the device isolation layer 390 may be formed in the well area W of the substrate 100 and some portions of the well area W defined by the device isolation layer 390 may be provided as active regions. For example, the device isolation layer 390 may be formed by a shallow trench isolation (STI) process.

Referring to FIG. 11B, a deep trench DT may be formed from the first surface 101 in such a way that the unit area UA may be enclosed by the deep trench DT. Particularly, the deep trench may be shaped into a reverse trapezoid in such a configuration that the width of the deep trench DT may decrease from the first surface 101 and the deep trench DT may be narrowed downwards into the substrate 100.

A mask pattern may be formed on the first surface 101 in such a way that the unit area UA may be covered by the mask pattern and a peripheral portion \of the unit area UA may be exposed through the mask pattern. Then, the substrate 100 may be partially removed by an etching process using the mask pattern as an etching mask, thereby forming the deep trench DT enclosing the unit area UA.

A dry etching or a wet etching process may be conducted to the substrate 100 until the substrate 100 may be recessed to a predetermined depth around the unit area UA. Thus, the well area W and the photoelectric converter layer 200*a* may be partially removed from the substrate 100. A bottom surface TBS of deep trench DT may be arranged around the second surface of the substrate 100. In such a case, a side surface TSS of the deep trench DT may be slanted in such a way that the deep trench DT may be narrowed downward from the first surface 101 to the second surface 102.

Referring to FIG. 11C, a dummy separation layer 470*a* may be formed on the first surface 101 to a sufficient thickness to fill up the deep trench DT. An insulation layer 410*a* may be formed on the bottom surface TBS and the side surface TSS of the deep trench DT and on the first surface 101 along the surface profile of the deep trench DT. Then, a dummy layer 420*a* may be formed on the insulation layer 410*a* to a sufficient thickness to fill up the deep trench DT.

The insulation layer 410*a* may cure the damages to the substrate caused by the etching process for forming the deep trench DT and may reflect the light toward the pixel area A and the reference pixel area B. For example, the insulation layer 410*a* may include silicon oxide and may be formed by an atomic layer deposition (ALD) process or a thermal oxidation process. Particularly, the insulation layer 410*a* may be formed into a liner extending on the first surface 101 of the substrate 100 along the surface profile of the deep trench DT. Thus, a sufficient width of a dummy pattern 420 in FIG. 11D may be obtained in spite of the downsize of the deep trench DT, and as a result, the metallic conductive pattern 450 in FIG. 11J may be formed to be sufficiently thick as much as possible.

In addition, the insulation layer 410*a* may include insulation materials having a refractive index smaller than that of the substrate 100, thereby refracting the slant light obliquely irradiated to an insulation pattern 410 in FIG. 11D to the pixel area A and the referenced pixel area B. In the present example embodiment, the insulation layer 410*a* may a refractive index of about 1.5.

While the present example embodiment discloses that the insulation layer 410*a* may include silicon oxide, any other materials may also be used for the insulation layer 410*a* as long as the material may have a sufficiently small refractive index and the damages to the substrate 100 caused by the etching process for forming the deep trench DT may be sufficiently cured by the material. For example, the insulation pattern 410 may include silicon nitride or silicon oxynitride.

Thereafter, the dummy layer 420*a* may be formed on the insulation layer 410*a* to a sufficient thickness to fill up the deep trench DT by a deposition process. Particularly, the dummy layer 420*a* may include dummy materials having a sufficient etch selectivity with respect to the substrate 100 and the insulation layer 410*a*. Examples of the dummy materials may include silicon germanium (SiGe), silicon oxide (SiO2), silicon nitride (SiN), boron silicate glass (BSG), polysilicon, etc. Those may be used alone or in combinations thereof.

Referring to FIG. 11D, the dummy separation layer 470*a* may be partially removed from the substrate 100 by a planarization process until the first surface 101 is exposed, thereby forming a dummy separation pattern 470 in the deep trench DT. Thus, the unit area UA may be defined by the dummy separation pattern 470.

For example, the chemical mechanical polishing process may be conducted on the dummy separation layer 470*a* until the first surface 101 is exposed. Thus, the dummy separation layer 470*a* may remain only in the deep trench DT, thereby forming the dummy separation pattern 470 having the insulation pattern 410 and the dummy pattern 420.

Particularly, the insulation layer 410*a* may remain just on the side surface TSS and the bottom surface TBS of the deep trench DT, thereby forming the insulation pattern 410 on the side surface TSS and the bottom surface TBS of the deep trench DT. In addition, the dummy layer 420*a* may remain only in the deep trench DT defined by the insulation pattern 410, thereby forming the dummy pattern 420 filling the deep trench DT and enclosed by the insulation pattern 410. The insulation pattern 410 may have a uniform thickness on the side surface TSS and the bottom surface TBS of the deep trench DT and the dummy pattern 420 may be formed into a reverse trapezoidal shape.

The photoelectric converter layer 200*a* may be separated by the pixel area A and the reference pixel area B, thereby forming the photoelectric converter 200 in each pixel area A and in each reference pixel area B. In the present example embodiment, the photoelectric converter 200 may be formed into a PN junction photo diode.

Referring to FIG. 11E, the signal generator 300 and the wiring structure 500 may be sequentially formed on the substrate 10. The signal generator 300 may generate the electric signals corresponding to an image of an object and the wiring structure 500 may be connected to the signal generator 300.

For example, a front end of line (FEOL) process of the semiconductor manufacturing process may be conducted on the active region of the well area W to form the transfer transistor 310, the floating diffusion node 320, and the signal transistor 330 on the active region as the signal generator 300. In the present example embodiment, the signal generator 300 may be formed at surface portions of the active region in the well area W. However, the arrangements of the transfer transistor 310, the floating diffusion node 320, and the signal transistor 330 may be varied according to the characteristics and requirements of the image sensor 910. Thus, some of transfer transistor 310, the floating diffusion node 320, and the signal transistor 330 may be arranged in the active region and the others may be arranged on the active region.

The transfer transistor 310 may extend from the first surface 101 downward in the well area W, and an end portion of the transfer transistor 310 may be positioned around the photoelectric converter 200. That is, the transfer transistor 310 may be provided as a vertical transfer transistor 312. Thus, the photoelectrons may be efficiently transferred to the floating diffusion node 320 from the photoelectric converter 200.

The floating diffusion node 320 may be positioned near the transfer transistor 310 and the photoelectrons may be transferred from the photoelectric converter 200 and accumulated in the floating diffusion node 320. The floating diffusion node 320 may be formed at surface portions of the first surface 101 between the transfer transistor 310 and the device isolation layer 390 by an ion implantation process. The floating diffusion node 320 may have a semiconductor type different from the well area W. Thus, the floating diffusion node 320 may formed by implanting the n-type dopants onto the active region of the well region W in the present example embodiment.

The signal transistor 330 may generate the electric signals in accordance with the accumulated photoelectrons at the floating diffusion node 320. The electric signals may indicate the image information of an object from which the incident light may be reflected. Thus, the electrical signal may be referred to as image signal if necessarily. The electric signal may be transferred to the ISP 950, and the ISP 950 may process the image signals to generate image data of the object.

At least the signal transistor 330 may be formed on the active region of the well area W. The active region on which the transfer transistor 310, the floating diffusion node 320, and the signal transistor 330 may be different and be isolated from one another by the device isolation layer 390. For example, the signal transistor 330 may include a reset transistor for discharging the photoelectrons from the floating diffusion node 320, a source follower transistor for amplifying the voltage of the floating diffusion node 320, and a selection transistor for detecting the amplified voltage of the floating diffusion node 320 in response to a selection signal. The floating diffusion node 320 may be connected to a source electrode of the reset transistor and simultaneously connected to a gate electrode of the source follower transistor SF. The source follower transistor SF may be connected to the selection transistor.

All of the reset transistor, the source follower transistor, and the selection transistor may be formed on the pixel area A or some of the reset transistor, the source follower transistor and the selection transistor may be formed on an additional transistor area adjacent to the pixel area A according to the configurations and requirements of the image sensor module 1000.

Each of the pixel areas A may include the photoelectric converter 200 and the signal generator 300 and may be separated from neighboring pixel areas A by the dummy separation pattern 470. Thus, each pixel area A may be formed into a unit pixel UP of the image sensor. A plurality of the unit pixels UP may be arranged in a matrix, and the image pixel unit Px may be formed in the illumination area IA of the substrate 100. Since the unit pixel UP may be formed at every pixel area A, a plurality of the unit pixels UP may be arranged in the pixel matrix.

Each of the reference pixel areas B may include the photoelectric converter 200 and the signal generator 300, and may be separated from neighboring reference pixel areas B by the dummy separation pattern 470. Thus, each reference pixel area B may be formed into a reference unit pixel RPx of the image sensor. The reference unit pixel RPx may generate the reference charges in response to the minimal light. At least a reference unit pixel RPx may be arranged along the column or the row of the pixel matrix and the reference pixel unit RPx may be formed in the black area BA of the substrate 100.

The contact area CA may be protected from the FEOL process for forming the signal generator 300 by the mask pattern. Thus, the unit area UA of the contact area CA may include a bulk silicon defined by the dummy separation pattern 470 and may be provided as the contact margin area C.

When the formation of the signal generator 300 is completed, a semiconductor chip wiring process such as a BEOL process may be conducted to the first surface 101 of the substrate 100, thereby forming the wiring structure 500 that may be connected to the signal generator 300.

For example, a first insulation interlayer 521 may be formed on the first surface 101 to such a thickness that the signal generator 300 may be covered by the first insulation interlayer 521 and a first plug P1 may be formed through the first insulation interlayer 521 in such a way that the first plug P1 may be connected to the signal generator 300. Then, a lower metal wiring M0 may be formed on the first insulation interlayer 521 in such a way that the lower metal wiring M0 may be contact with the first plug P1. Then, a second insulation interlayer 522 may be formed on the first insulation interlayer 521 for covering the lower metal wiring M0 and a second plug P2 may be formed through the second insulation interlayer 522 to contact the lower metal wiring M0. A first metal wiring M1 may be formed on the second insulation interlayer 522 in such a way that the first metal wiring M1 may contact the second plug P2. A third insulation interlayer 523 may be formed on the second insulation interlayer 522 and the first metal wiring M1 may be insulated from surroundings by the third insulation interlayer 523.

Therefore, the lower metal wiring M0, the first metal wiring M1, the first plug P1, and the second plug P2 may be constitute the conductive line 510. The first to third insulation interlayers 521, 522 and 523 may constitute the insulation layer 520, thereby forming the wiring structure 500.

Accordingly, the unit pixel UP and the reference unit pixel RPx may be formed in the substrate 100 and the signal generator 300 may be formed at surface portions of the substrate in the illumination area IA and the black area BA of the substrate 100. Then, the wiring structure 500 may be formed across the on the illumination area IA, the black area BA, and the contact area CA of the substrate 100, thereby forming the image sensor 910.

Particularly, the image sensor 910 may be formed into a single image sensor chip ISC and the image signal processor 950 may be formed into a single logic chip LC. Then, the pixel chip and the logic chip may be boned to each other by a semiconductor packing process, thereby forming the image sensor module 1000, as described in detail hereinafter.

Referring to FIG. 11F, the ISP 950 may be manufactured into an individual logic chip LC by using an additional substrate 958 and may be bonded to image sensor chip ISC. For example, the operation device OD of the ISP 950 such as the operating driver 951, the signal detector 953, the timing generator 955 and the signal buffer 957 may be formed on the additional substrate 958 by the conventional semiconductor manufacturing process. The operating driver 951, the signal detector 953, the timing generator 955 and the signal buffer 957 may have substantially the same structures as those described in detail with reference to FIGS. 7 to 10, thus any further detailed descriptions on the same operation device OD elements are omitted.

Then, additional wiring structures 989 may be formed on the additional substrate 958 by a wiring process such as a BEOL process. The additional wiring structures 959 may be covered by an insulation layer and may be connected to the operation device OD of the ISP 950. That is, the ISP 950 may be provided as an individual logic chip LC.

In the present example embodiment, the image sensor 910 may be provided as an image sensor chip ISC and the ISP 950 may be provided as the logic chip LC. Thus, the image sensor structure 910 and the ISP may be combined to each other by a chip bonding process, thereby forming a package structure 990. For example, the logic chip LP and the image sensor chip ISC may be bonded into a chip scale package by a chip scale package process.

Referring to FIG. 11G, the package structure 990 may be turned upside down in such a way that the second surface 102 may face upwards and the logic chip LC may face downwards. Then, a thinning process may be conducted to the substrate 100 until the dummy separation pattern 470 and the photoelectric converter 200 may be exposed.

For example, a grinding process may be conducted to the second surface 102 of the substrate 100 and an overall thickness of the substrate 100 may be reduced. Thus, the second surface 102 may become closer to the first surface 101 and the photoelectric converter 200 and the dummy separation pattern 470 may be exposed. In the present example embodiment, the second surface 102 may correspond to a top surface of the photoelectric converter 200 and a top surface of the pixel separation pattern 400 after the thinning process.

Figure 11H:
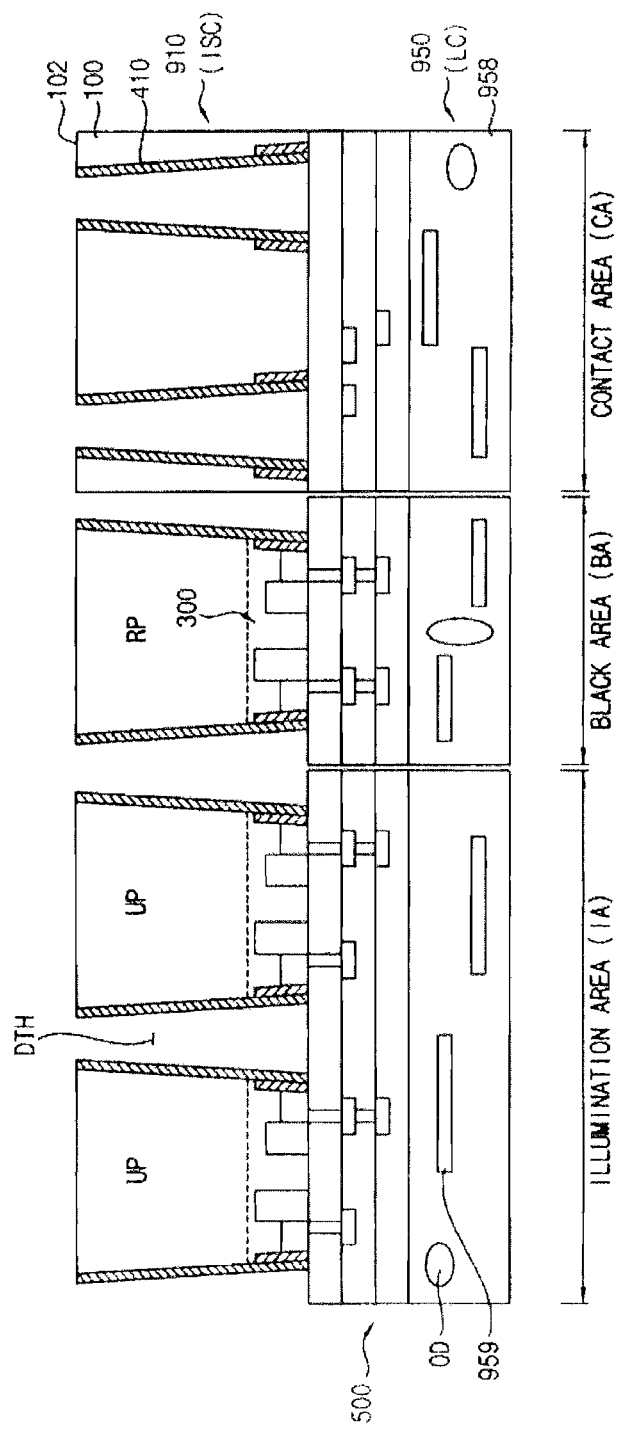
Figure 111:
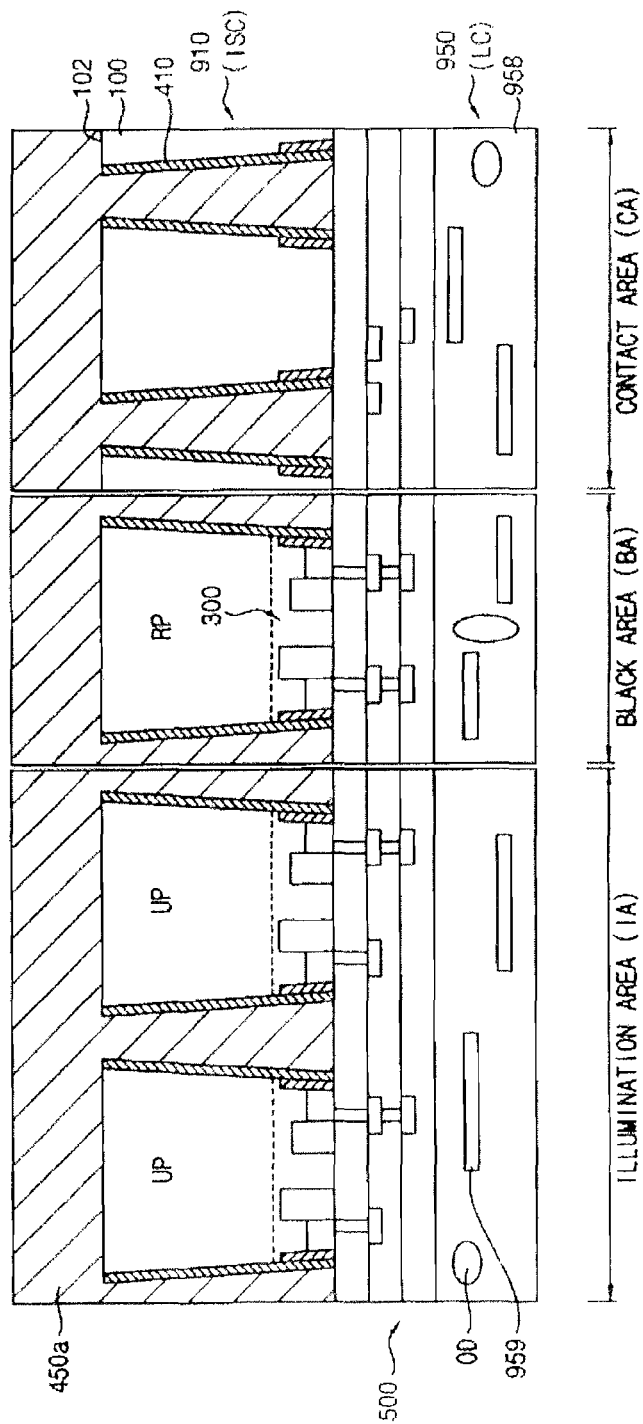

Referring to FIG. 11H, the dummy pattern 420 may be removed from the substrate 100 by an etching process, to thereby form a deep trench hole DTH defined by the insulation pattern 410 and closed by the first insulation interlayer 521 of the wiring structure 500.

For example, a wet etching process may be conducted to the dummy pattern 420 by using an etchant having an etching selectivity with respect to the substrate 100 and the insulation pattern 410. The dummy pattern 420 may be removed from the substrate 100 without substantial loss of the insulation pattern 410 and the wiring structure 500.

When the dummy pattern 420 may include silicon germanium (SiGe), the etchant for the wet etching process may include an aqueous ammonium peroxide solution which is widely known as a standard clean-1 (SC-1) solution. Otherwise, when the dummy pattern 420 may include silicon oxide, the etchant for the wet etching process may include an aqueous hydrofluoric (HF) solution. In addition, when the dummy pattern 420 may include silicon nitride, boron silicate glass (BSG) or polysilicon, the etchant for the wet etching process may include an aqueous phosphoric solution, an aqueous hydrofluoric solution, an aqueous hydrofluoric (HF) solution and an aqueous ammonium solution, respectively.

In the present example embodiment, the dummy pattern 420 may include silicon germanium (SiGe) having a maximal etching selectivity with respect to the substrate 100, the aqueous ammonium peroxide solution, or the standard clean-1 (SC-1) solution may be used as the etchant for selectivity etching the dummy pattern 420.

Referring to FIG. 11I, a conductive layer 450a may be formed on the second surface 102 of the substrate 100 to a sufficient thickness to fill up the deep trench hole DTH. The conductive layer 450a may include a low resistive metallic conductive material.

For example, when the low resistive metallic conductive material includes a metal nitride, e.g., titanium nitride (TiN) and/or tantalum nitride (TaN), the conductive layer 450a may be formed by an atomic layer deposition (ALD) process. In contrast, when the low resistive metallic conductive material includes single metal, e.g., tungsten (W) and copper (Cu), the conductive layer 450a may be formed by a chemical vapor deposition (CVD) process. Particularly, when copper (Cu) is used as the low resistive metallic conductive material, the conductive layer 450a may be grown from the first insulation interlayer 512 by an electroplating process until the deep trench hole DTH is sufficiently filled with the conductive layer 450a.

In a modified example embodiment, the conductive layer 450a may include a transparent conductive oxide (TCO) having a refractive index sufficiently smaller than that of the substrate 100. For example, an indium tin oxide (ITO) layer may be formed on the first insulation interlayer 512 and the photoelectric converter 200 to such a thickness as to fill up the deep trench hole DTH. In such a case, although the incident light may be obliquely irradiated onto the unit pixel UP and may transmit through the insulation pattern 410, the slant light may be refracted again into the photoelectric converter 200, thereby increasing the receiving efficiency of the light.

Particularly, since the high temperature metallic process for forming the conductive layer 450a may be formed at a side of the substrate opposite to the first surface 101, the thermal damages to the signal generator 300 and the wiring structure 500 may be sufficiently prevented in the metallic process. Thus, the conductive layer 450a may be formed on the photoelectric converter 200 and the first insulation interlayer 521 without substantial thermal damages to the signal generator 300 and the wiring structure 500.

In addition, since the low resistive metallic conductive materials may have gap fill characteristics much better than the polysilicon, the conductive layer 450a may be much more uniform in the deep trench hole DTH even when the aspect ratio of the deep trench hole DTH may become high. The uniformity of the conductive layer 450a may reduce the electrical resistance of the conductive pattern 450 in FIG. 11J when the negative bias may be applied to the conductive pattern 450.

Figure 11J:
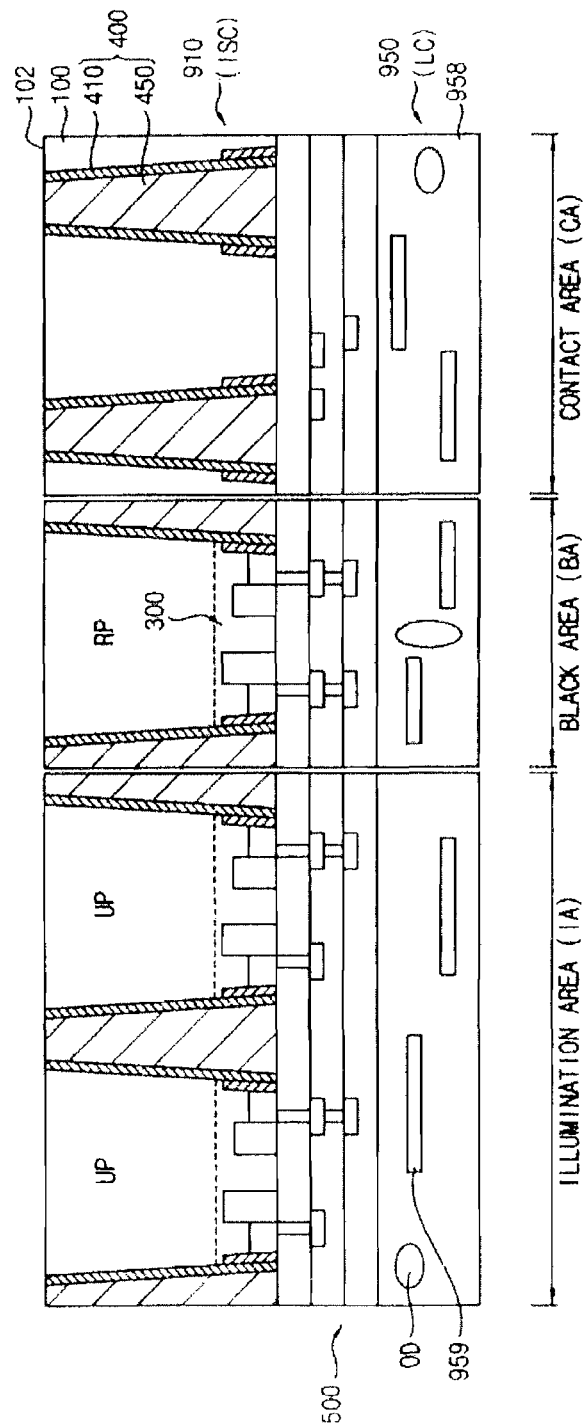

Referring to FIG. 11J, the conductive layer 450a may be partially removed from the substrate 100 by a planarization process until the second substrate 102 of the substrate may be exposed, thereby forming the conductive pattern 450 in the deep trench hole DTH. The insulation pattern 410 and the conductive pattern 450 in the deep trench hole DTH may be formed into the pixel separation pattern 400.

For example, a chemical mechanical polishing (CMP) process may be conducted to the conductive layer 450a until the second substrate 102 may be exposed. Thus, the conductive layer 450a may remain just in the deep trench hole DTH and be separated by the deep trench hole DTH, thereby forming the conductive pattern 450 in the deep trench hole DTH. Accordingly, the dummy pattern 420 may be replaced with the conductive pattern 450 and the dummy separation pattern 470 having the insulation pattern 410 and the dummy pattern 420 may be replaced with the pixel separation pattern 400 having the insulation pattern 410 and the conductive pattern 450.

The conductive pattern 450 may function as an electrode to which the negative bias may be applied. Since the conductive pattern 450 may include a low resistive conductive material, the negative bias may be stably applied to the conductive pattern 450, thereby efficiently preventing the generation of the dark currents on boundary surface between the photoelectric converter 200 and the insulation pattern 410.

According to the conventional image sensor, the separation pattern enclosing the unit pixel may include a relatively high resistive polysilicon and thus the negative bias may be unstably applied to the polysilicon pattern of the separation pattern. For that reason, the dark current may not be sufficiently removed from the surface of the separation pattern, which gives rise to the noise defect and deteriorates the image quality of the conventional image sensor.

In contrast, according to example embodiments, since the polysilicon is replaced with the low resistive metallic conductive pattern 450 without substantial thermal damages to the signal generator 300 and the wiring structure 500, the negative bias may be sufficiently applied to the pixel separation pattern 400. Thus, the dark current may be sufficiently reduced in the image sensor module 1000.

Referring to FIG. 11K, the buffer layer 600 may be formed on the pixel separation pattern 400 and the photoelectric converter 200. For example, the metal oxide layer 610 may be formed on the pixel separation pattern 400 and the photoelectric converter 200, and the anti-reflection layer 620 may be formed on the metal oxide layer 610. The metal oxide layer 610 and the anti-reflection layer 620 may be formed by the CMP process.

In the present example embodiment, the metal oxide layer 610 may include an aluminum oxide layer having a plurality of fixed charges. Since the fixed charges of the aluminum oxide may have high negative potential, the photoelectrons of the photoelectric converter 200 may be prevented from being trapped on a boundary surface between the photoelectric converter 200 and the metal oxide layer 610. The anti-reflection layer 620 may prevent the incident light from being reflected outwards from the unit pixel UP, thereby increasing the light receiving efficiency of the photoelectric converter 200.

The passivation layer 630 may be further formed on the anti-reflection layer 620. The passivation layer 630 may include silicon oxide.

Referring to FIG. 11L, the buffer layer 600, the bulk silicon substrate and the wiring structure 500 may be sequentially and partially removed from the contact area CA of the substrate 100, thereby forming a contact hole CH through which the ISP 950 may be exposed.

For example, a mask pattern may be formed on the buffer layer 600 in such a configuration that the illumination area IA and the black area BA may be covered by the mask pattern and the contact area CA may be covered by the mask pattern. Then, a dry etching process such as a plasma etching process may be conducted to the package structure 990 in such a way that the buffer layer 600 corresponding to the contact area CA, the substrate 100 of the contact margin area C and the wiring structure 500 on the contact margin area C of the substrate 100 may be partially removed until the operation device OD may be exposed, thereby forming the contact hole CH through which the operation device OD of the ISP 950 may be exposed.

Figure 11M:
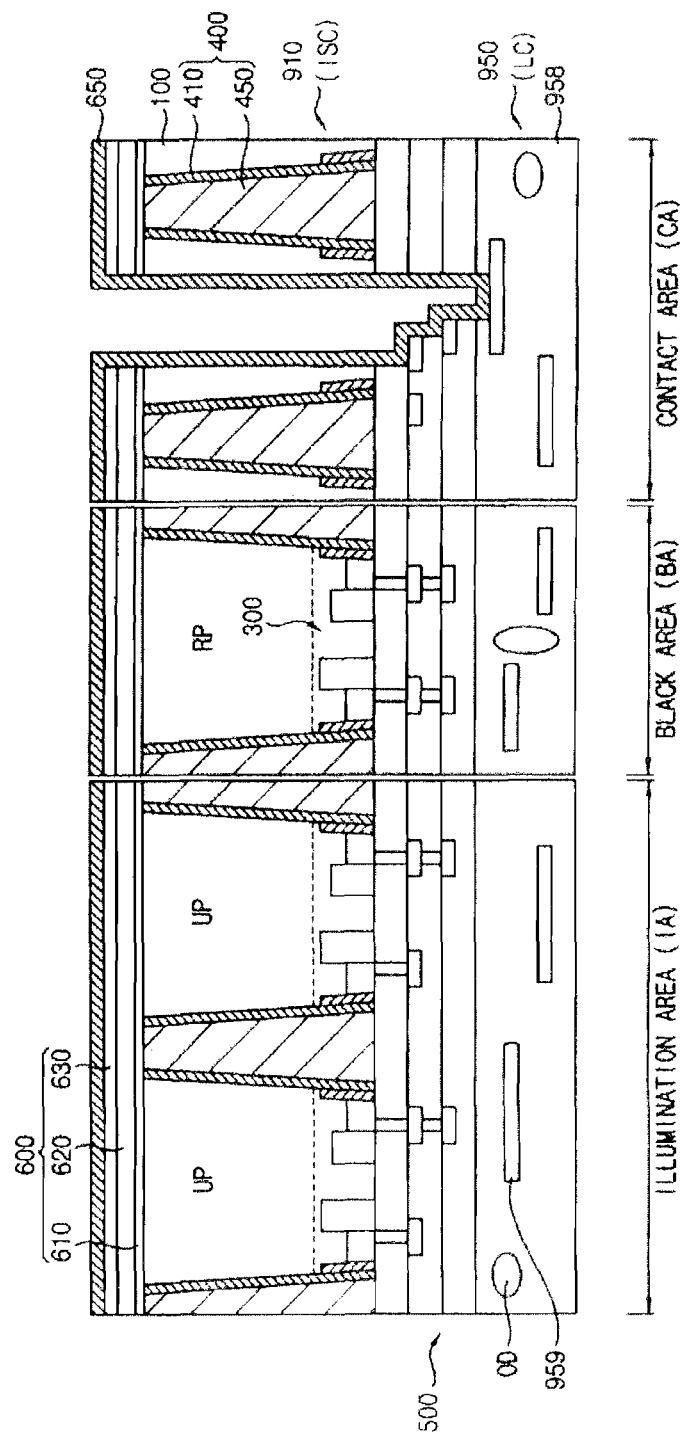

Referring to FIG. 11M, the conductive cover layer 650 may be arranged on the buffer layer 600 and on sidewall and bottom of the contact hole CH. Thus, the cover layer 650 may contact the wiring structure 500 and the ISP 950 in the contact hole CH.

For example, a low resistive conductive material may be deposited onto the buffer layer 600 and the sidewall and the bottom of the contact hole CH by an ALD process, thereby forming the cover layer 650 on the buffer layer 600 and the sidewall and the bottom of the contact hole CH. The cover layer 650 may include conductive materials having low electrical resistance such as tungsten (W), titanium (Ti), tantalum (Ta) and a nitride thereof.

Figure 11N:
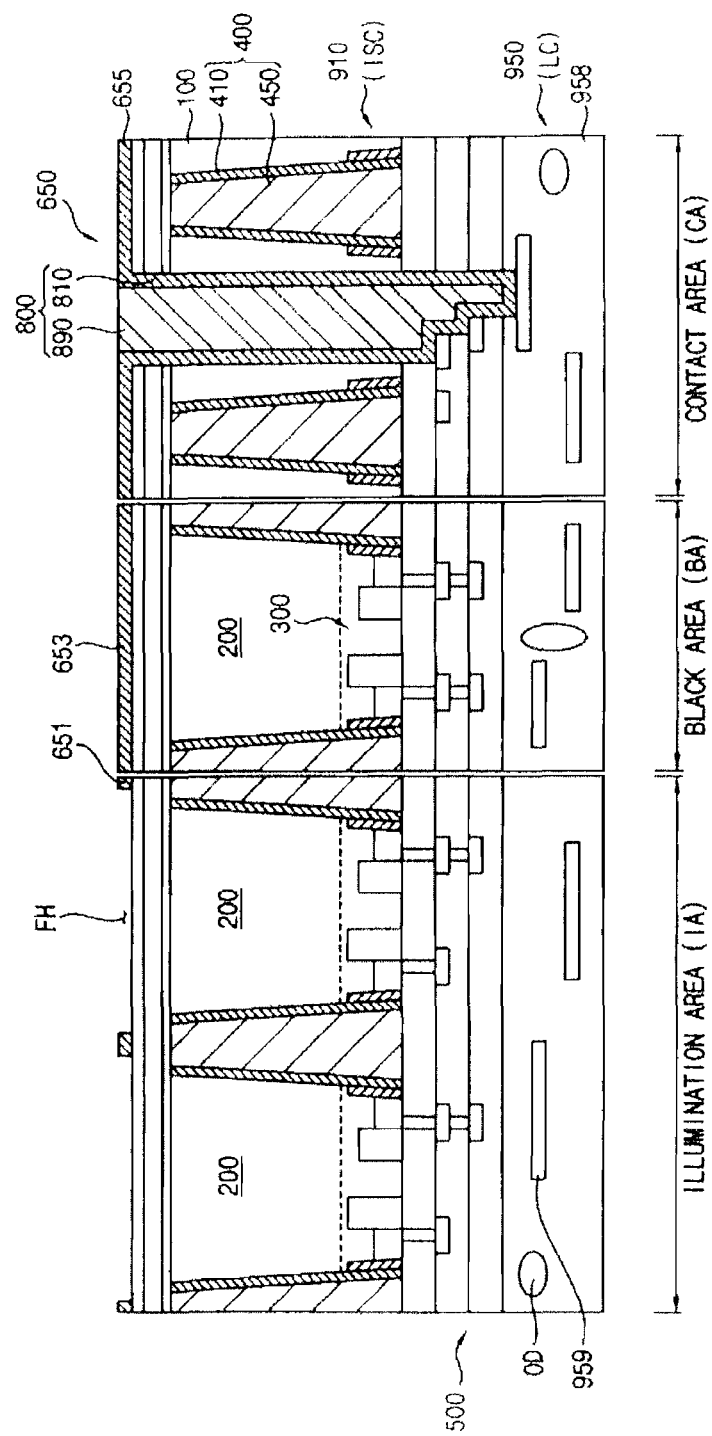
Figure 110:
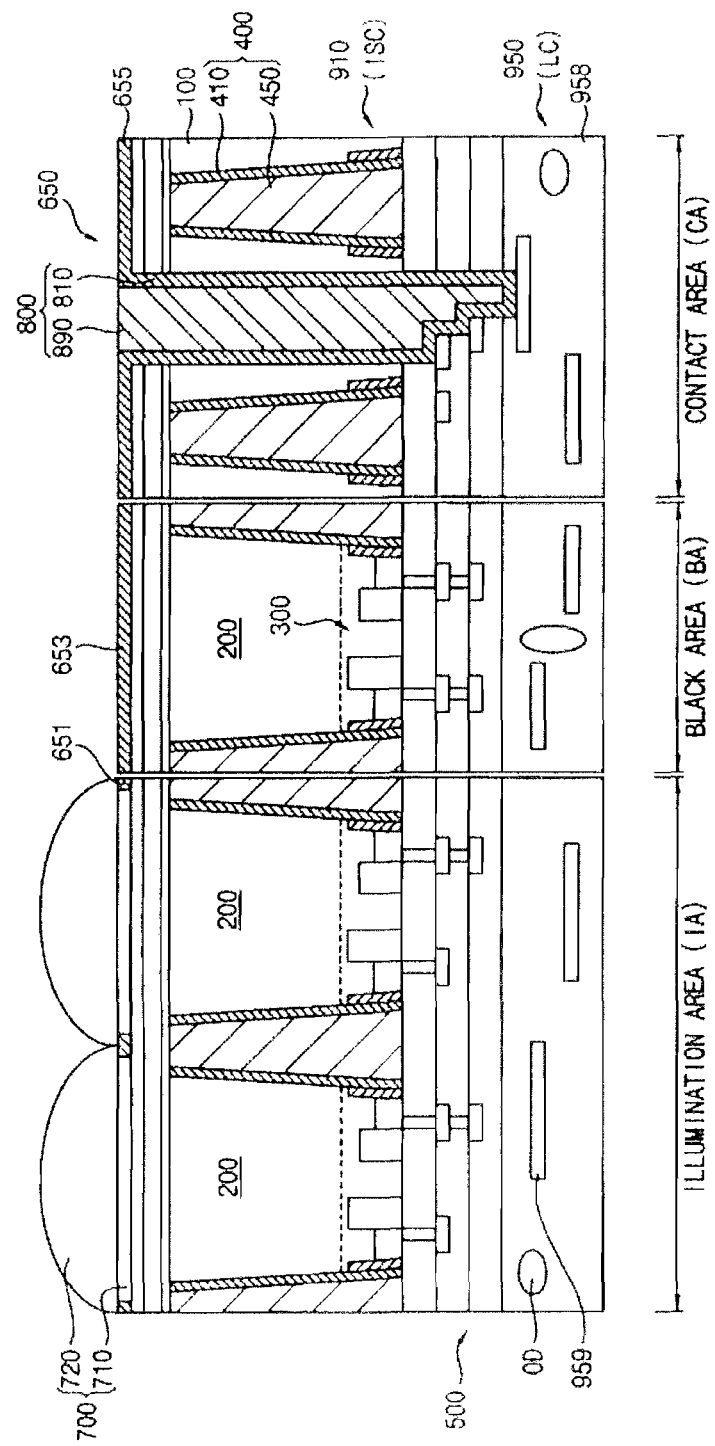

Referring to FIG. 11N, the insulation column 890 may be formed in the contact hole CH in the contact area CA of the substrate and the cover layer 650 may be formed into the grid pattern 651, the optical block pattern 653 and the contact pad 655 in the illumination area IA, the black area BA and the contact area CA of the substrate 100, respectively.

For example, a supplemental insulation layer may be formed on the cover layer 650 to a sufficient thickness to fill up the contact hoe CH, and then the supplemental insulation layer may be planarized until the cover layer may be exposed. Thus, the supplemental insulation layer may remain only in the contact hole CH as the insulation column 890. Thus, the insulation column 890 may be enclosed by the cover layer 650 in the contact hole CH and an upper surface of the insulation column 890 may be coplanar with an upper surface of the cover layer 650. The supplemental insulation layer may include an insulation material such as a silicon oxide. Particularly, the cover layer 650 on the sidewall and the bottom of the contact hole CH may function as a vertical contact line for contacting both of the wiring structure 500 and the ISP 950, thereby forming the contact extender 810 in the contact hole CH. The contact extender 810 may enclose the insulation column 890 in the contact hole CH and the contact hole CH may be filled with the contact extender 810 and the insulation column 890. The contact extender 810 and the insulation column 890 may constitute the contact structure 800.

In addition, the cover layer 650 on the buffer layer 600 in the contact area CA of the substrate 100 may be integrally provided with the contact extender 810 in one body and may function as a contact pad 655 for enlarging the contact area of the contact extender 810. That is, the cover layer 650 in the contact area CA may be divided into the contact extender 810 in the contact hole CH and the contact pad 655 that may be arranged on the buffer layer 600 and may be connected to the contact extender 810.

The cover layer 650 in the black area BA may function as an optical block pattern 653 for blocking the light transmittance into the reference pixel unit RPx. Thus, the photoelectric converter 200 in the reference pixel area B may generate the photoelectrons in response to a minimal light and the photoelectrons of the reference pixel unit RPx may be provided as the reference charges of the image sensor module 1000.

The cover layer 650 in the illumination layer IA may be partially removed from the buffer layer 600 in such a way that the buffer layer 600 on the photoelectric converter 200 may be exposed and the cover layer 650 on the separation pattern may be remain, thereby forming a filter hole FH and the grid pattern 651 defining the filter hole FH. The slant light that may be obliquely incident onto the unit pixel UP may be reflected from the grid pattern 651 into the photoelectric converter 200, thereby increasing the light receiving efficiency of the photoelectric converter 200.

Referring to FIG. 11O, another mask pattern may be formed on the optical block pattern 653, the contact pad 655 and the contact structure 800 and then the color filter 710 may be formed in the filter hole FH.

For example, a color filter layer may be formed on the to the buffer layer 600 of the illumination area IA by a dyeing process, a pigment dispersion process and a printing process. Then, the color filter layer may be partially removed from the package structure 990 by a photolithography process and a planarization process until the grid pattern 651 may be exposed, thereby forming the color filter 710 in the filter hole FH.

Thereafter, the micro lens 720 may be formed on the color filter 710 by the unit pixel UP and may be arranged on each of the photoelectric converters 200. For example, the micro lens may have a convex shape that may be divulged towards the incident direction of the light.

Thereafter, the mask pattern may be removed from the package structure 990 and the optical block pattern 653, the contact pad 655 and the contact structure 800 may be exposed, thereby forming the image sensor module in FIGS. 7 to 10.

FIGS. 12A to 12E are cross sectional views of stages in a method of manufacturing the image sensor module in FIG. 3 in accordance with another example embodiment.

Figure 12A:
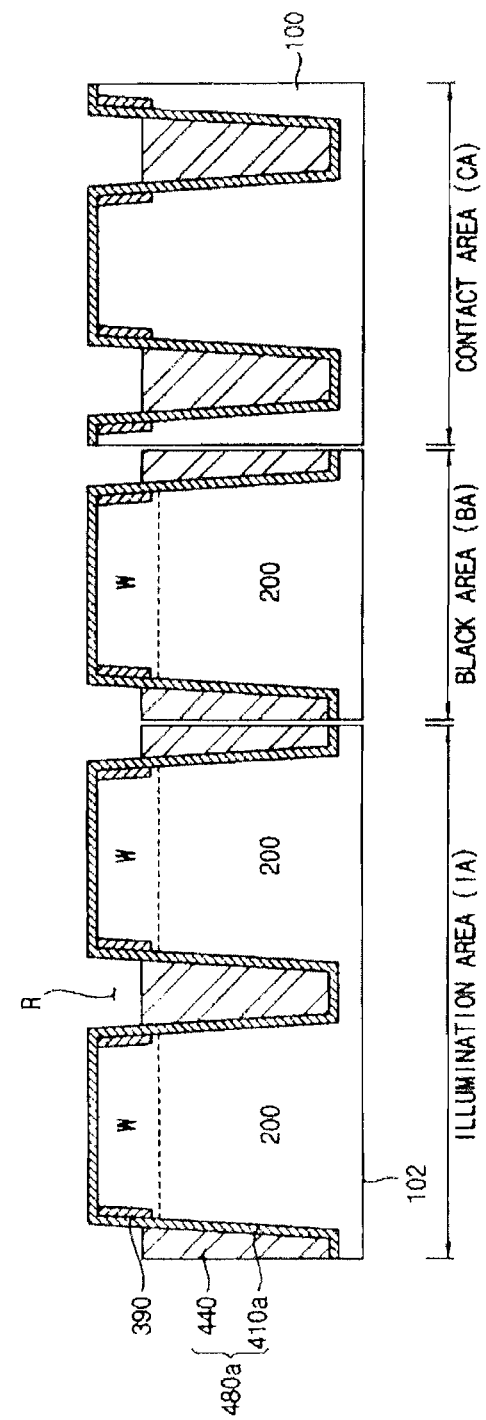
FIGS. 12A to 12E illustrate cross sectional views of stages in a method of manufacturing an image sensor module having the image sensor in FIG. 3.

Referring to FIG. 12A, after the dummy layer 420a may be formed on the substrate 100 by the same processes described in detail with reference to FIGS. 11 A to 11C, an etch-back process may be conducted to the conductive layer 450a by using the insulation layer 410a as an etch stopper, thereby separating the dummy layer 420a by the deep trench DT.

Thus, the insulation layer 410a may be exposed to surroundings and the dummy layer 420a may be formed into a reduced dummy pattern 440 in the deep trench DT. A top surface of the reduced dummy pattern 440 may be lower than a top surface of the insulation layer 410a and a recess R may be provided at an upper portion of the deep trench DT in such a configuration that the recess R may be defined by the reduced dummy pattern 440 and the insulation layer 410a.

Figure 12B:
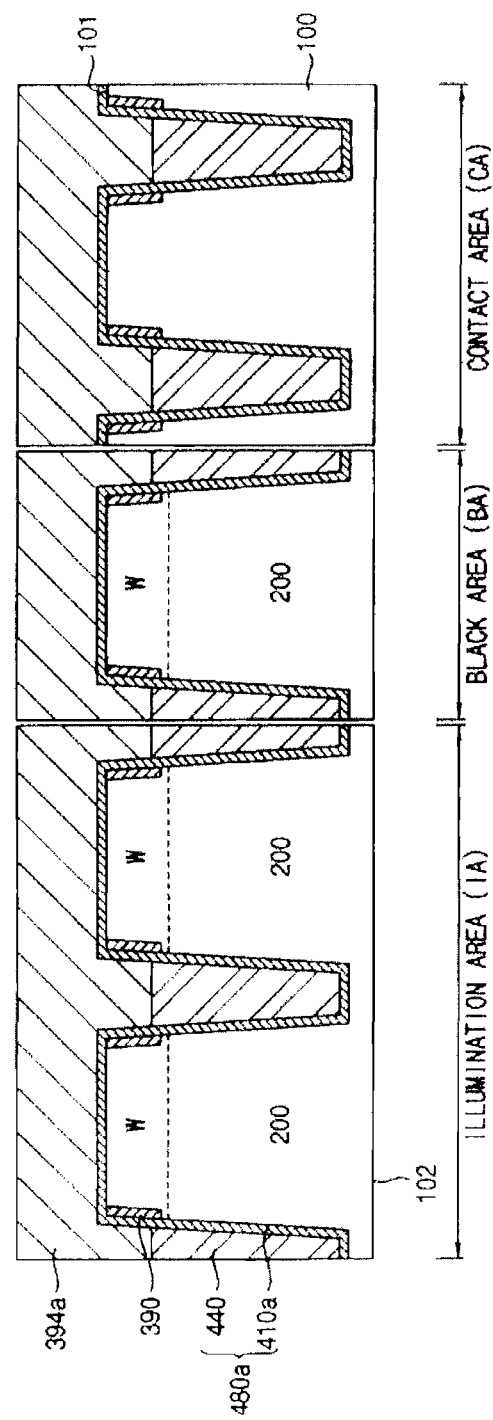

Referring to FIG. 12B, an additional separation layer 394a may be formed on the insulation layer 410a and the reduced dummy pattern 440 to a sufficient thickness to fill up the recess R. For example, an oxide having good gap fill characteristics may be deposited onto the insulation layer 410a and the reduced dummy pattern 440 by a CVD process, thereby forming the additional separation layer 394a on the insulation layer 410a and the reduced dummy pattern 440.

Figure 12C:
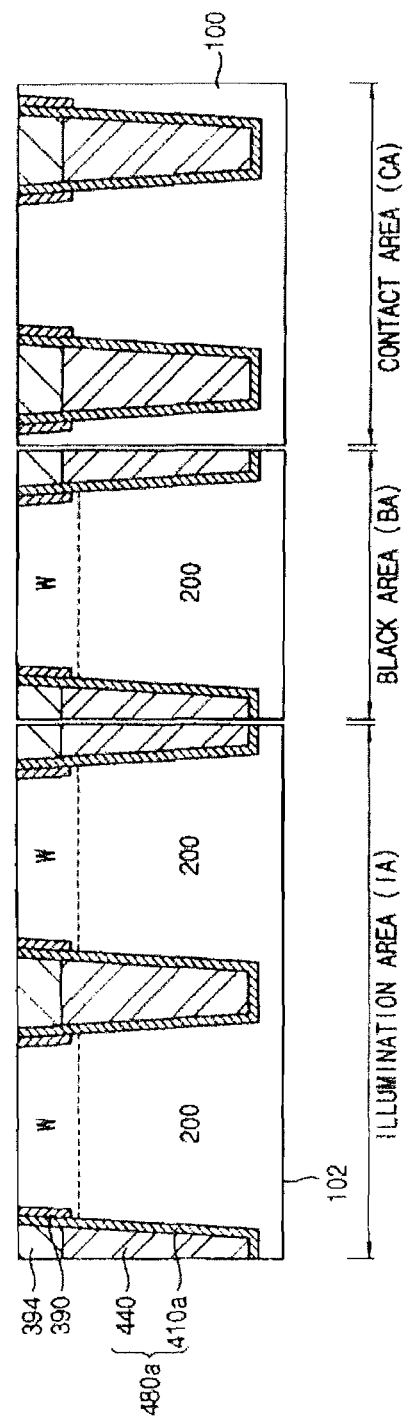

Referring to FIG. 12C, the additional separation layer 394a and the insulation layer 410a may be planarized until the first surface 101 and the device isolation layer 390 may be exposed, thereby forming the additional separation pattern 394 in the recess R.

For example, a CMP process may be conducted to the additional separation layer 394a and the insulation layer 410a and the additional separation layer 394a may remain only in the recess R and may be separated by the recess R. In addition, the insulation layer 410a may also be separated by the deep trench DT.

Accordingly, the deep trench DT may be filled with the reduced dummy pattern 440, the additional separation pattern 394 and the insulation pattern 410, thereby forming a modified dummy pattern 480 in the deep trench DT. The top surfaces of the additional separation pattern 394 and the insulation pattern 410 may be coplanar with the first surfaces 102 and a top surface of the device isolation layer 390.

Figure 12D:
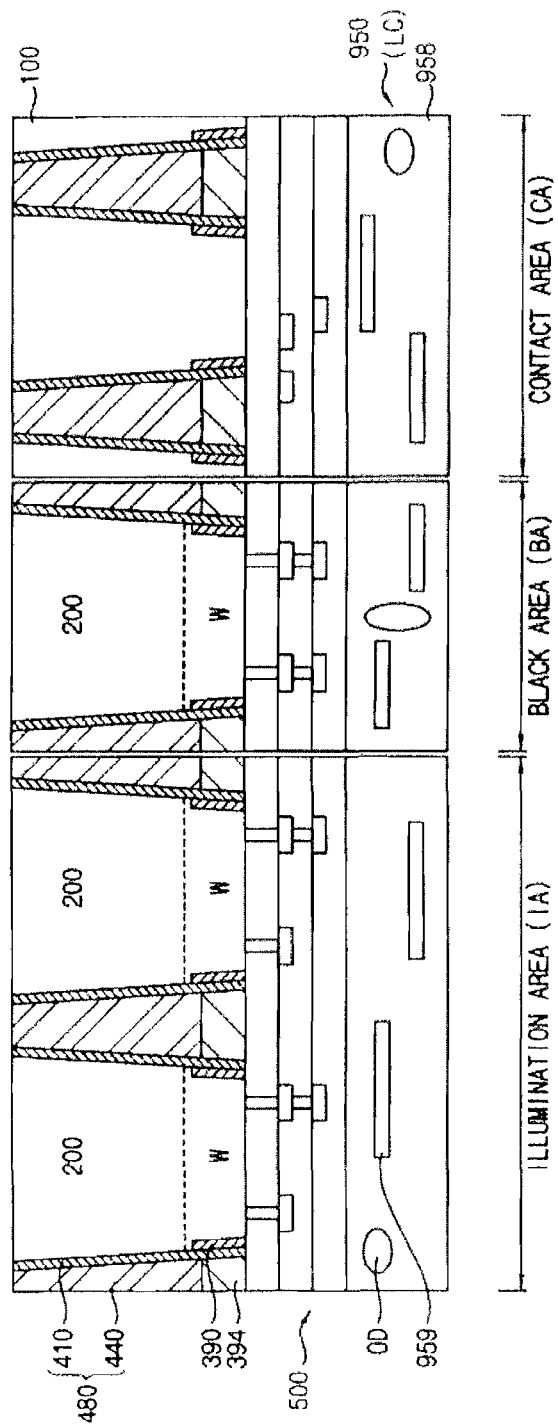

Referring to FIG. 12D, the wiring structure 500 and the ISP 950 may be formed on the first surface 101 of the substrate 100 by the same processes as described in detail with references to FIGS. 11E to 11G, thereby forming a package structure 992. In such a case, the ISP 950 may be provided as an additional logic chip LC. Thereafter, the package structure 992 may be turned upside down in such a way that the second surface 102 may face upwards and the logic chip LC may face downwards. Thereafter, a thinning process may be conducted to the second surface 102 of the substrate 100 until the dummy separation pattern 470 and the photoelectric converter 200 may be exposed. Thus, the second surface 102 may become closer to the first surface 101 and the photoelectric converter 200 and the modified dummy pattern 480 may be exposed.

Figure 12E:
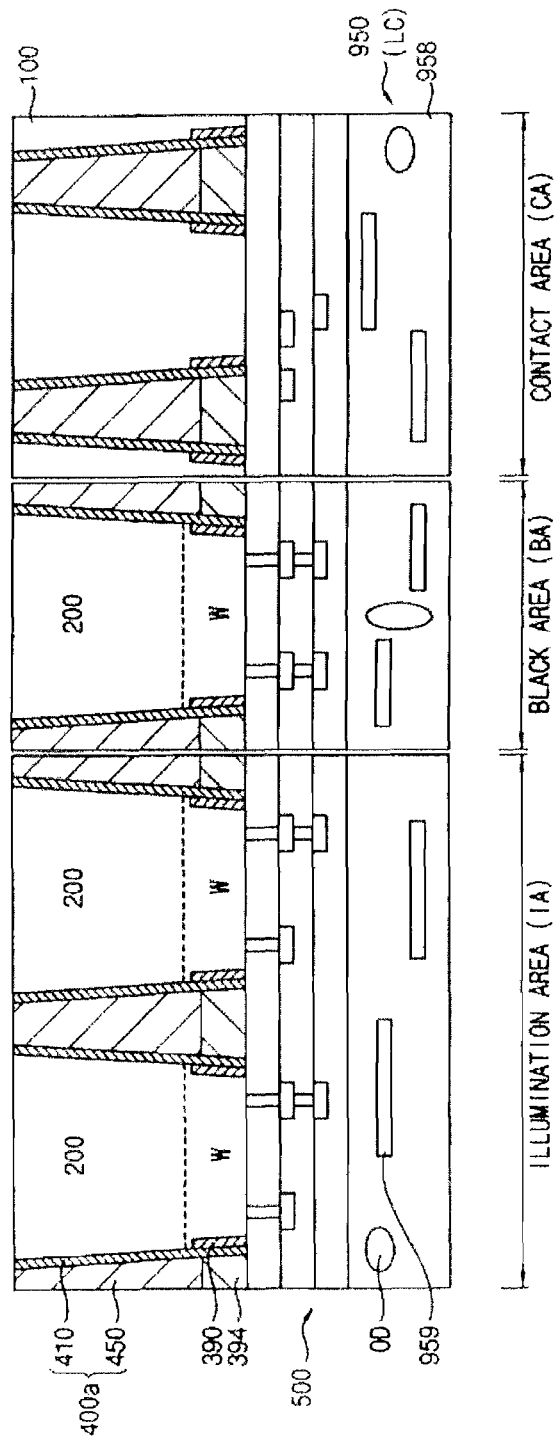

Referring to FIG. 12E, the reduced dummy pattern 440 may be replaced with the conductive layer 450a by the same processes as described in detail with references to FIGS. 11H to 11I, thereby forming a first modified pixel separation pattern 400a in the deep trench hole DTH.

The conductive layer 450a may extend from a surface of the additional separation pattern 394 to the second surface 102 of the substrate 100, so that the height of the conductive layer 450a may be smaller than that of the conductive pattern 450 in FIG. 9 as much as the thickness of the additional separation pattern 394. Thus, the aspect ratio of the conductive layer 450a may be reduced as much as the thickness of the additional separation pattern 394, thereby decreasing the gap fill defect of the conductive layer 450a and increasing the uniformity of the conductive layer 450a. The uniformity of the first modified conductive pattern 450a may reduce the electrical resistance of the conductive layer 450a, and thus the negative bias may be more stably applied to the conductive layer 450a.

Thereafter, the same processes as described in detail with references to FIGS. 11J to 11O may be conducted to the package structure 992 having the first modified pixel separation pattern 400a, thereby manufacturing the image sensor module having the image sensor in FIG. 3.

Figure 13A:
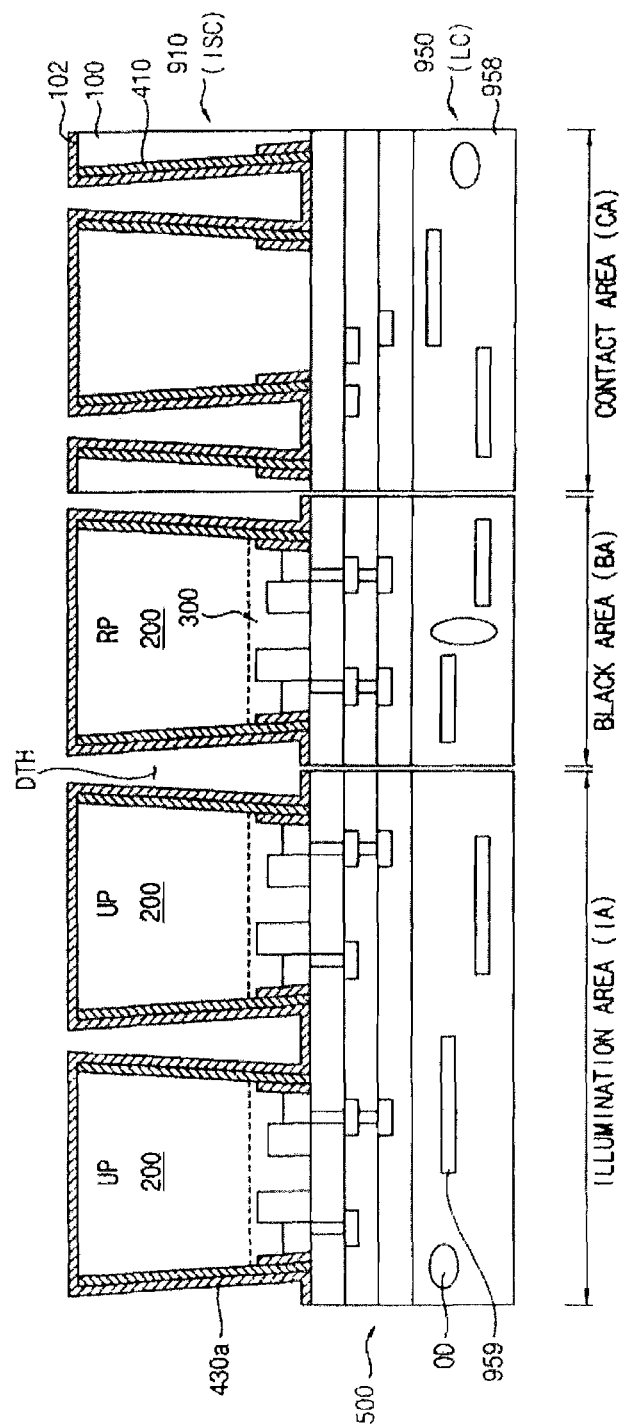
FIGS. 13A to 13C illustrate cross sectional views of stages in a method of manufacturing an image sensor module having the image sensor in FIG. 4.
Figure 13B:
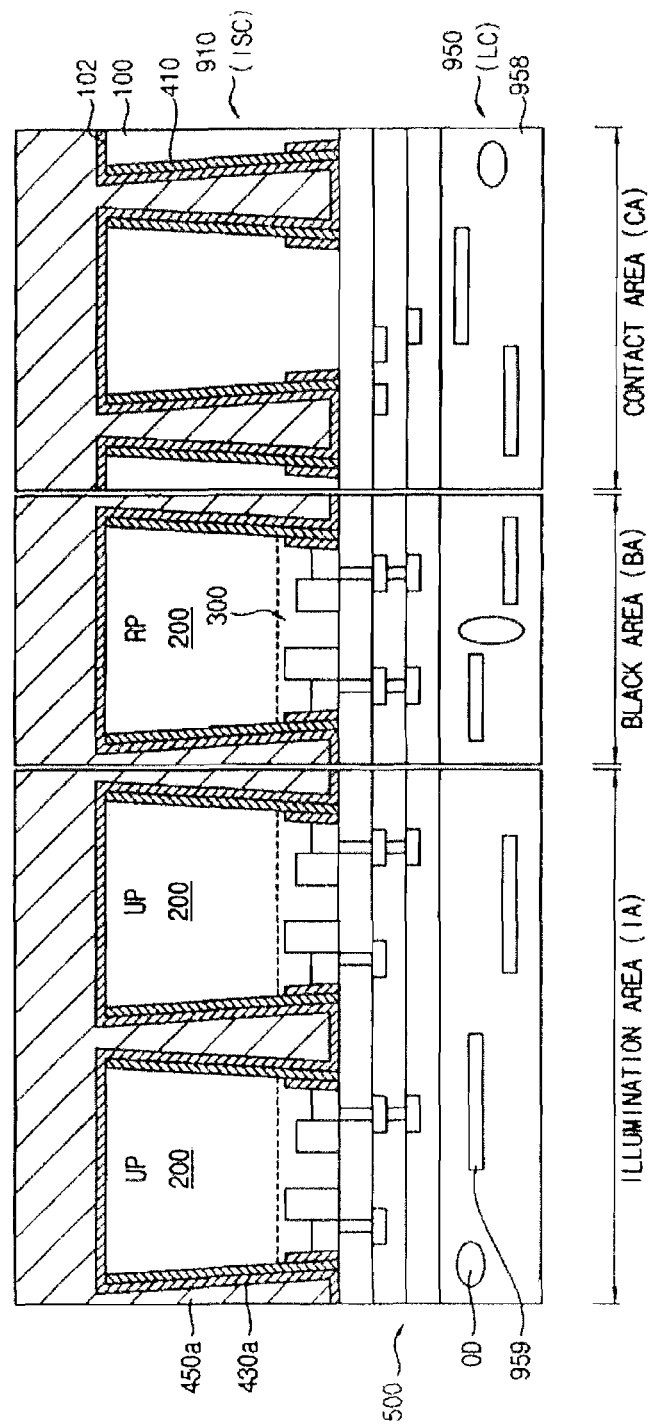
Figure 13C:
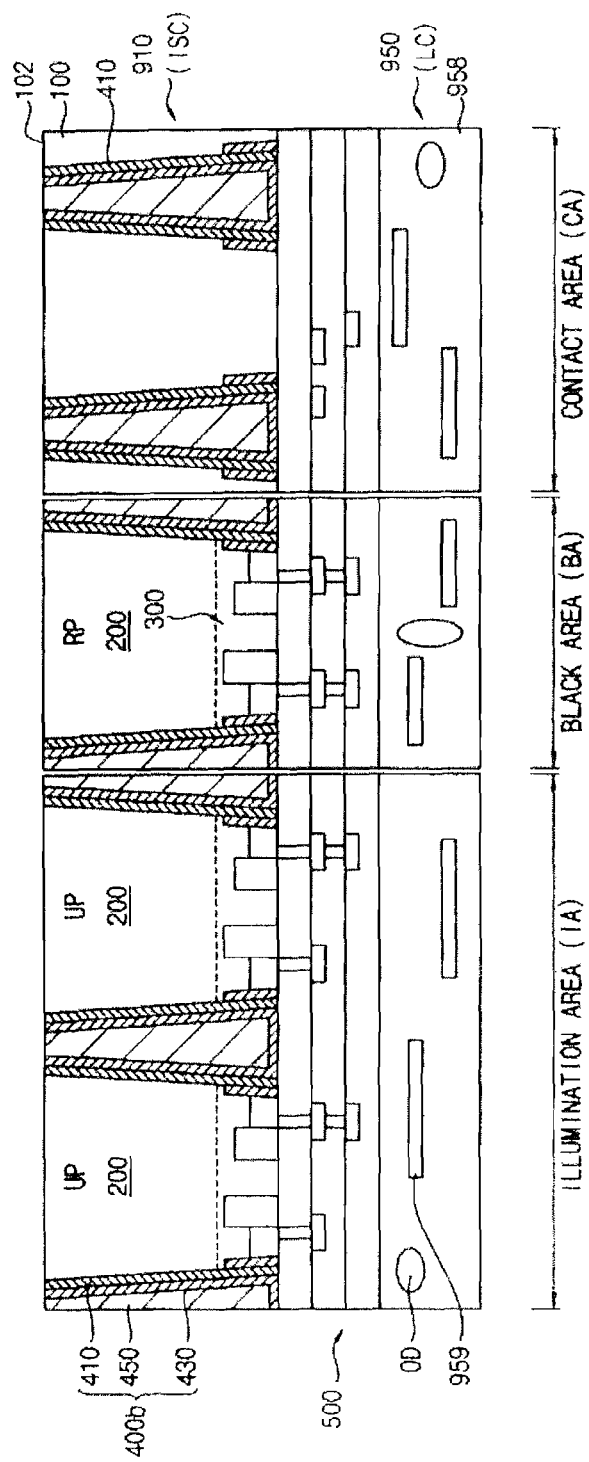

FIGS. 13A to 13C are cross sectional views illustrating stages in method of manufacturing the image sensor module having the image sensor in FIG. 4.

Referring to FIG. 13A, after the deep trench hole DTH may be formed in the package structure 990 by the same processes as described in detail with references to FIGS. 11A to 11H, a protection layer 430a may be formed on the first insulation interlayer 521, the photoelectric converter and the first surface 101 of the substrate 100 along a surface profile of the deep trench hole DTH.

The protection layer 430a may protect the second surface 102 and the photoelectric converter 200 from a subsequent CMP process for forming the conductive pattern 450. Thus, the silicon substrate may be protected from the high temperature metal replacement process. For example, the protection layer 430a may include any one material of silicon oxide, silicon nitride and silicon oxynitride.

Particularly, the protection layer 430a may include a material having a refractive index smaller than that of the substrate 100, which may increase the light receiving efficiency of the unit pixel UP.

Referring to FIG. 13B, the conductive layer 450a may be formed on the second surface 102 of the substrate 100 to a sufficient thickness to fill up the deep trench hole DTH by the same process as described in detail with reference to FIG. 11I. The conductive layer 450a may include a low resistive metallic conductive material.

Referring to FIG. 13C, the conductive layer 450a and the protection layer 430a may be partially removed from the substrate 100 by a planarization process until the second substrate 102 of the substrate may be exposed, thereby forming the conductive pattern 450 and a protection pattern 430 in the deep trench hole DTH by the same processes as described in detail with references to FIG. 11J. The insulation pattern 410, the protection pattern 430 and the conductive pattern 450 in the deep trench hole DTH may be formed into a second modified pixel separation pattern 400b.

Thereafter, the same processes as described in detail with references to FIGS. 11K to 11O may be conducted to the package structure 990 having the second modified pixel separation pattern 400b, thereby manufacturing the image sensor module having the image sensor in FIG. 4.

Thus, the second surface 102 of the substrate 100 may be sufficiently protected from the high temperature metal replacement process by the protection layer 430a, thereby preventing or minimizing the noise defects caused by the surface defects of the second substrate 100.

By way of summation and review, a CIS may include a plurality of pixels in a 2×2 matrix shape and at least a photoelectric converter, e.g., a photo diode, is arranged at each pixel. The incident light is converted into electric signals by the photoelectric converter.

A pair of neighboring pixels adjacent to each other may be separated by a pixel separation pattern, so the electric signals generated individually from each of the neighboring pixels can be electrically separated by the pixel separation pattern. The pixel separation pattern may include insulation materials having different refractive indices from the substrate, so an incident light passing into each pixel is prevented from being refracted into the neighboring pixel by the pixel separation pattern. Therefore, a signal interference between the neighboring pixels, widely known as the crosstalk defect, may be sufficiently prevented by the pixel separation pattern.

Polysilicon may be filled in the pixel separation pattern, and the pixel separation pattern may function as an electrode for applying a negative bias for minimizing dark currents of the CSI. However, when an aspect ratio of a deep trench for the separation pattern increases (as the cell size of the image sensor decreases), it may be difficult to fill polysilicon into the deep trench of the pixel separation pattern. In addition, the relatively high resistance of the polysilicon (with a relatively high aspect ratio), the electrical resistance of the polysilicon may be significantly increased due to the gap fill defects of the polysilicon in the deep trench, and therefore, may be insufficient for minimizing the dark currents in the image sensor. Further, the difficulties of filling polysilicon into the deep trench makes the filling process much more complex, which significantly reduces the manufacturing efficiency of the image sensor.

In contrast, example embodiments provide an image sensor having a pixel separation pattern into which a low resistive metal pattern is filled. Other example embodiments provide an image sensor module having the above image sensor, as well as a method of manufacturing the above image sensor.

That is, according to exemplary embodiments, the conductive pattern of the separation pattern in the deep trench hole may include a low resistive metal in place of polysilicon. Thus, the negative bias may be stably applied to the separation pattern and the dark currents may be efficiently removed in the image sensor. Further, as the polysilicon may be replaced with the low resistive metal by a metal replacement process conducted on the second surface of the substrate without any thermal damages to the signal generator and the wiring structures, the negative bias may be stably applied to the pixel separation pattern and the image quality of the image sensor may be significantly improved in the present without any damages to the signal generator and the wiring structures.

Furthermore, the separation pattern may be shaped into a trapezoid in which the width may decrease from the first surface on which the wiring structure is arranged to the second surface on which the buffer layer is arranged. Since the second surface may correspond to a back side or a rear surface of the substrate and the incident light may be irradiated onto the second surface, the image sensor may be configured into a back side illumination (BSI) structure and the trapezoidal pixel separation pattern may enlarge the receipt area of the incident light, thereby increasing the efficiency of image sensor.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An image sensor, comprising:
a photoelectric converter in a pixel area of a substrate to generate photoelectrons in response to an incident light that is incident onto the pixel area;
a signal generator on a first surface of the substrate in the pixel area to generate electric signals corresponding to image information of an object in accordance with the photoelectrons; and
a pixel separation pattern penetrating through the substrate from the first surface of the substrate to a second surface of the substrate opposite to the first surface of the substrate, the pixel separation pattern including:
an insulation pattern through the substrate and having a refractive index smaller than that of the substrate, and
a metallic conductive pattern through the substrate and along sidewalls of the insulation pattern, the metallic conductive pattern enclosing the insulation pattern, and the pixel area being enclosed by the pixel separation pattern and isolated from a neighboring pixel area,
wherein the metallic conductive pattern surrounds an entire perimeter of the insulation pattern, as viewed in a top view, and
wherein each of the metallic conductive pattern and the insulation pattern extends from the first surface of the substrate to the second surface of the substrate to penetrate through an entire thickness of the substrate, the metallic conductive pattern being in direct contact with each of the first and second surfaces of the substrate, and the insulation pattern being in direct contact with each of the first and second surfaces of the substrate.

2. The image sensor of claim 1, wherein a cross-section of the pixel separation pattern within the substrate has a trapezoid shape, a width of the trapezoid shape decreasing from the first surface to the second surface of the substrate.

3. The image sensor of claim 2, wherein the insulation pattern has a uniform thickness between the first surface and the second surface, and the metallic conductive pattern has a non-uniform thickness that decreases from the first surface to the second surface.

4. The image sensor of claim 2, further comprising an additional separation pattern in contact with the insulation pattern adjacent the first surface and separating adjacent pixel areas, the additional separation pattern including a boundary surface coplanar with the first surface of the substrate and an inner surface contacting the metallic conductive pattern in the substrate.

5. The image sensor of claim 2, wherein the pixel separation pattern includes a protection pattern between the insulation pattern and the metallic conductive pattern.

6. The image sensor of claim 5, wherein the insulation pattern and the protection pattern have a uniform thickness, respectively, between the first surface and the second surface, and the metallic conductive pattern has a non-uniform thickness between the first surface and the second surface.

7. The image sensor of claim 5, further comprising an additional separation pattern in contact with the insulation pattern adjacent the first surface and separating adjacent pixel areas, the additional separation pattern including a boundary surface that is coplanar with the first surface of the substrate and an inner surface that is in contact with the protection pattern.

8. The image sensor of claim 1, wherein the pixel separation pattern includes an air gap in the metallic conductive pattern, the air gap including a void filled with air.

9. The image sensor of claim 1, further comprising:
a wiring structure on the first surface of the substrate and connected to the signal generator;
a buffer layer on the second surface of the substrate; and
a light transmitting unit on the buffer layer, the incident light being incident onto the photoelectric converter through the light transmitting unit.

10. The image sensor of claim 1, wherein the metallic conductive pattern overlaps an entire sidewall of the photoelectric converter, and the metallic conductive pattern includes at least one of titanium nitride (TiN), tantalum nitride (TaN), tungsten (W), copper (Cu), transparent conductive oxide (TCO) and combinations thereof.

11. An image sensor module, comprising:
an image sensor having a plurality of unit pixels to generate electric signals corresponding to an image of an object in accordance with an incident light, the plurality of the unit pixels being on a substrate and separated from one another by a pixel separation pattern penetrating through the substrate, the pixel separation pattern having:
an insulation pattern, and
a metallic conductive pattern along sidewalls of the insulation pattern, the metallic conductive pattern surrounding an entire perimeter of the insulation pattern, as viewed in a top view,
wherein each of the metallic conductive pattern and the insulation pattern penetrates through an entire thickness of the substrate, the metallic conductive pattern being in direct contact with each of upper and lower surfaces of the substrate, and the insulation pattern being in direct contact with each of the upper and lower surfaces of the substrate; and
an image signal processor (ISP) electrically connected to the image sensor and processing the electric signals to generate image data of the object.

12. The image sensor module of claim 11, wherein a cross-section of the pixel separation pattern of the image sensor within the substrate has a trapezoid shape, a width of the trapezoid shape decreasing from a first surface of the substrate to a second surface of the substrate opposite to the first surface.

13. The image sensor module of claim 12, wherein the image sensor includes an additional separation pattern in contact with the insulation pattern around the first surface and separating neighboring unit pixels, the additional separation pattern including a boundary surface that is coplanar with the first surface of the substrate and an inner surface that is in contact with the metallic conductive pattern in the substrate.

14. The image sensor module of claim 12, wherein the pixel separation pattern of the image sensor includes a protection pattern between the insulation pattern and the metallic conductive pattern.

15. The image sensor module of claim 14, the image sensor includes an additional separation pattern in contact with the insulation pattern around the first surface and separating neighboring pixel areas, the additional separation pattern including a boundary surface that is coplanar with the first surface of the substrate and an inner surface that is contact with the protection pattern.

16. The image sensor module of claim 11, wherein:
the substrate includes an illumination area onto which the incident light is incident, a black area onto which the incident light is blocked, and a contact area through which a contact structure penetrates the substrate,
at least one photoelectric converter to generate photoelectrons in response to the incident light is arranged in the unit pixels of the illumination area and the black area, and
the at least one photoelectric converter and the contact structure are enclosed by the pixel separation pattern in each of the illumination area, the black area, and the contact area of the substrate, respectively.

17. The image sensor module of claim 16, wherein the image sensor includes:
a signal generator arranged on a first surface of the substrate in each unit pixel to generate the electric signals in accordance with the photoelectrons;
a wiring structure on the first surface of the substrate and connected to the signal generator;
a buffer layer on a second surface opposite to the first surface of the substrate; and
a light transmitting unit on the buffer layer in the illumination area, the incident light being focused on the photoelectric converter through the light transmitting unit.

18. The image sensor module of claim 17, wherein the image sensor includes:
a grid pattern on the buffer layer corresponding to the pixel separation pattern in the illumination area of the substrate, a slant light obliquely incident onto the unit pixel being reflected to the photoelectric converter from the grid pattern;
an optical block pattern covering the buffer layer in the black area of the substrate, the optical block pattern blocking the incident light from entering into the photoelectric converter in the black area; and
a contact pad covering the buffer layer in the contact area of the substrate and in contact with the contact structure.

19. The image sensor module of claim 18, wherein the contact structure includes:
a conductive contact extender in contact with the contact pad and penetrating through the substrate to contact the wiring structure and the ISP; and
an insulation column through the substrate and enclosed by the contact extender.

20. The image sensor module of claim 16, wherein the image sensor includes an image sensor chip on the substrate, and the ISP includes a logic chip on an additional substrate different from the substrate, the image sensor chip and the ISP chip being electrically connected with each other by the contact structure.

21. The image sensor of claim 1, wherein upper surfaces of the metallic conductive pattern and the insulation pattern are level with each other and with the second surface of the substrate, and lower surfaces of the metallic conductive pattern and the insulation pattern are level with each other and with the first surface of the substrate.

22. The image sensor of claim 1, wherein:
each of the metallic conductive pattern and the insulation pattern is continuous from the first surface of the substrate to the second surface of the substrate, and a thickness of the substrate, as measured from the first surface to the second surface, equals a thickness of each of the metallic conductive pattern and the insulation pattern, as measured along a thickness direction of the substrate.

* * * * *